United States Patent [19]

Kondoh et al.

[11] Patent Number: 5,264,849

[45] Date of Patent: Nov. 23, 1993

[54] OPTICAL A/D CONVERSION USING ASYMMETRICAL-NEURAL-NETWORKS

[75] Inventors: Hiroshi Kondoh, Sendai; Shiro Satoh, Oogawaramachi, both of Japan

[73] Assignees: Ricoh Company, Ltd., Tokyo; Ricoh Research Institute of General Electronics Co., Ltd., Natori, both of Japan

[21] Appl. No.: 917,330

[22] Filed: Jul. 23, 1992

[30] Foreign Application Priority Data

Jul. 24, 1991 [JP] Japan .................. 3-184844

[51] Int. Cl.$^5$ ............................................. H03M 1/22
[52] U.S. Cl. ...................................... 341/137; 341/155
[58] Field of Search ............... 341/137, 155, 126, 13, 341/14

[56] References Cited

U.S. PATENT DOCUMENTS

| | | | |
|---|---|---|---|
| 3,641,564 | 2/1972 | Fassett et al. | 341/137 |
| 4,374,384 | 2/1983 | Moates | 341/137 X |
| 4,851,840 | 7/1989 | McAulay | 341/137 |

FOREIGN PATENT DOCUMENTS

| | | | |
|---|---|---|---|
| 2-248935 | 10/1990 | Japan . | |
| 1403376 | 6/1988 | U.S.S.R. | 341/137 |

OTHER PUBLICATIONS

"An Optical Analog-Digital Converter-Design and Analysis", IEEE Journal of Quantum Electronics, vol. QE-15, No. 4, Apr. 1987, Henry F. Taylor. pp. 210-216.

"2-Bit GSample/S Electooptic Guided-Wave Analog-to-Digital Converter", IEEE Journal of Quantum Electronics, vol. QE-18, No. 10, Oct. 1982, R. A. Becker and Frederick J Leonberger, pp. 1411-1413.

"Simple 'Neural' Optimization Network: An A/D Converter, Signal Decision Circuit, and a Linear Programming Circuit", IEEE Transaction on Circuits and Systems, vol. 33, No. 5, May 1986, David Tank and John J. Hopfield, pp. 533-541.

"Analysis of Correct Action Neural Network", NC89-27(1989)49 of IEICE Technical Report, Koji Nakajima, et al. pp. 49-54.

"Implementation of a Class of Asymmetrical Neural Networks with Application to A-D Converter", Feb. 1992, pp. 103-111, No. 2, vol. J75-C-II, Transaction of IEICE. Shigeo Sato, et al.

*Primary Examiner*—Sharon D. Logan
*Attorney, Agent, or Firm*—Oblon, Spivak, McClelland, Maier & Neustadt

[57] ABSTRACT

An analog signal having a value A is converted into an n-bit digital signal. An optical calculation part performs a part of a calculation shown below for an A/D conversion as below.

$$U_i = [\{\{\Sigma(W_{ij} \times X_j) + h_i\} \times V\} + A] \times S_i \ldots \quad (1)$$

The calculation of the equation (1) is performed for i=0, 1, ..., n−1 respectively;
the $W_{ij}$ is 0 if $i \geq j \geq 0$, or $-(2^{}j)$ if $j > i \geq 0$; hi is $-(2^{}i)$, or $-\{(2^{**}i) - \epsilon\}(|\epsilon| \leq 1)$;
V and $S_i$ respectively have any desired positive values and the said Σ represents a summation of each expression following thereto for j=0, 1, ..., n−1. The thresholding compares the result $U_i$ of the calculation of each equation (1) to a threshold value, and then 1 or 0 is selected. The result of the selection is then assigned to $X_i$. The calculation of the equation (1) is then performed repeatedly until $X_i$ converge on solutions. The solution of each $X_i$ is then provided as digital values of the n-bit digital signal.

12 Claims, 18 Drawing Sheets

FIG. IA
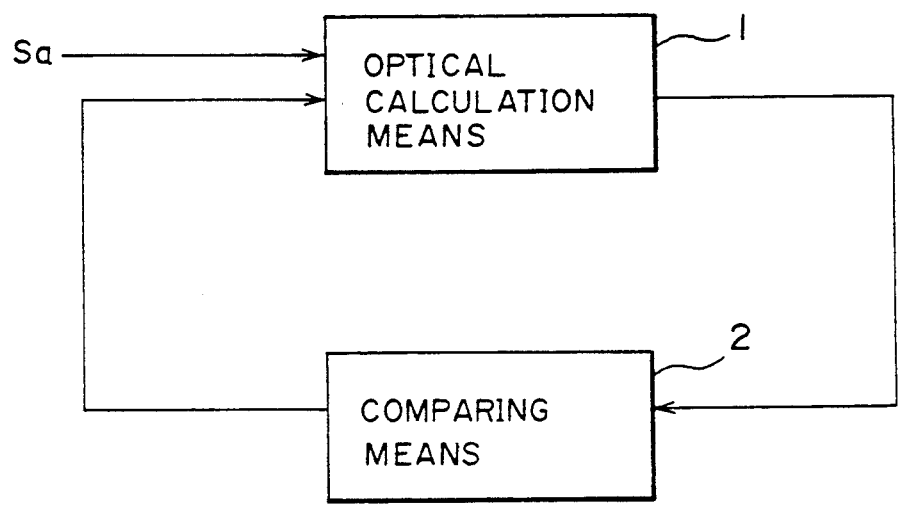
FIG. IB
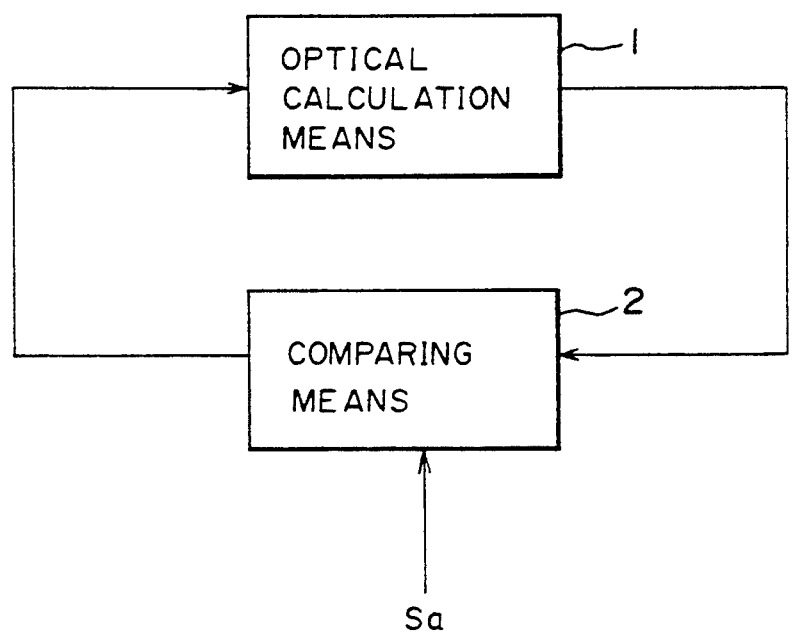

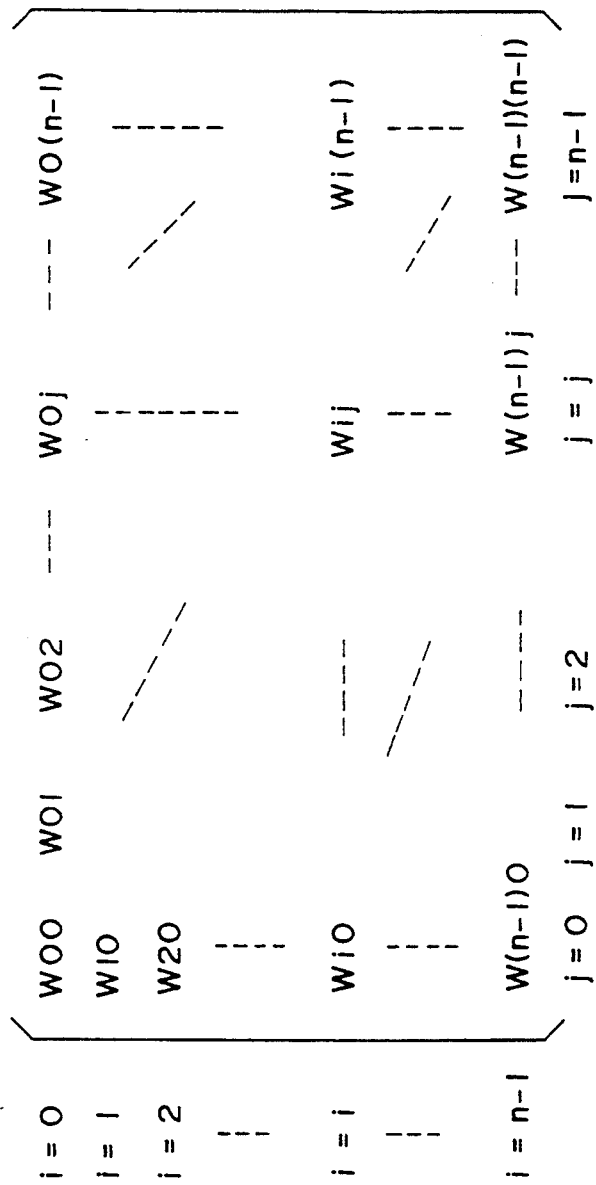

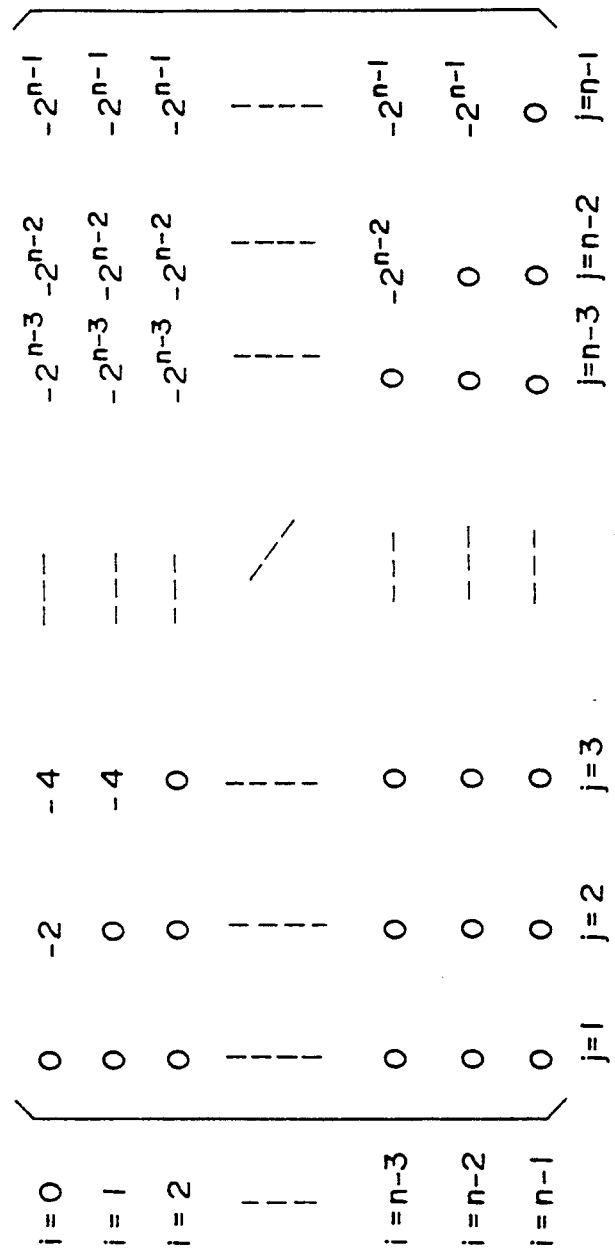

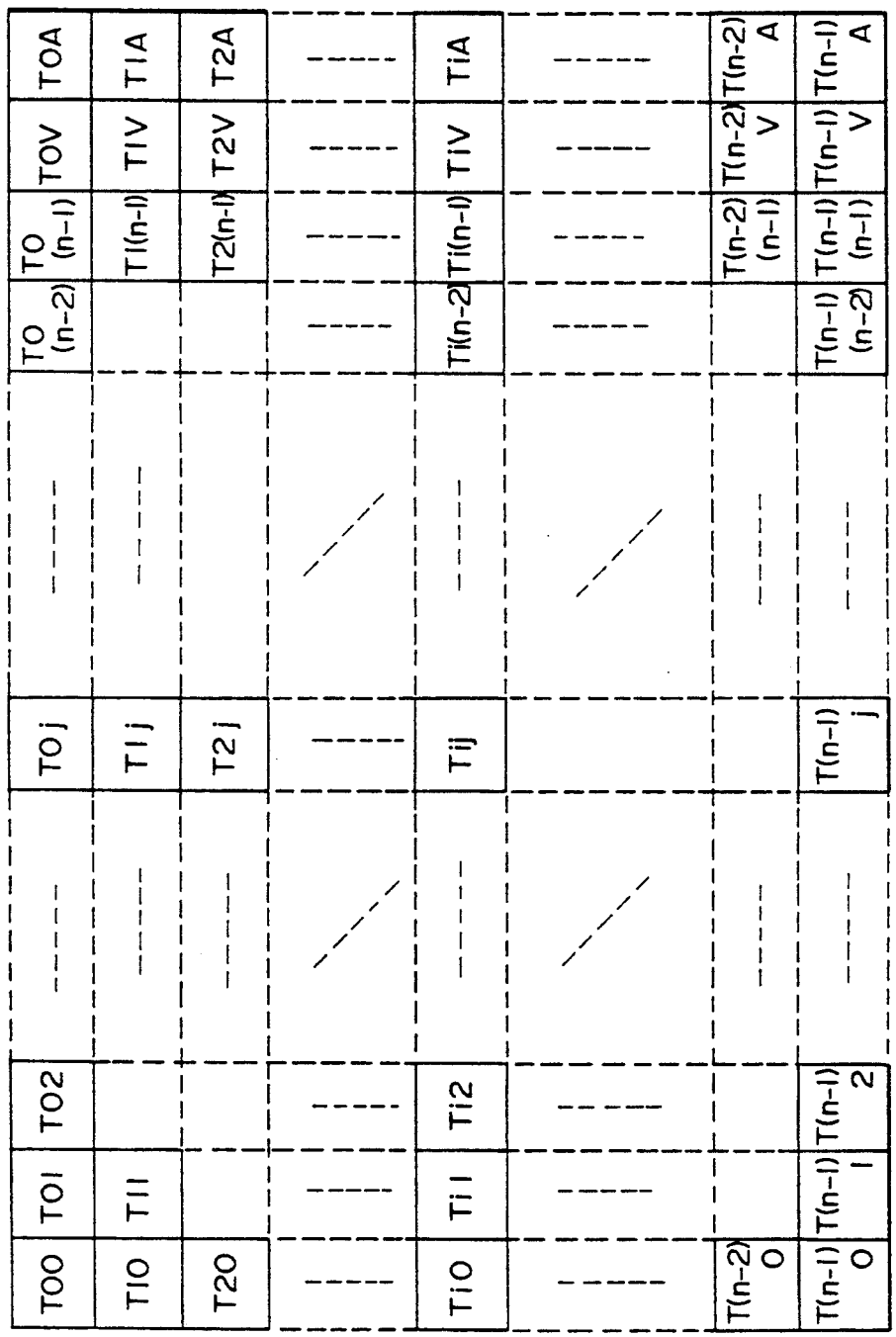

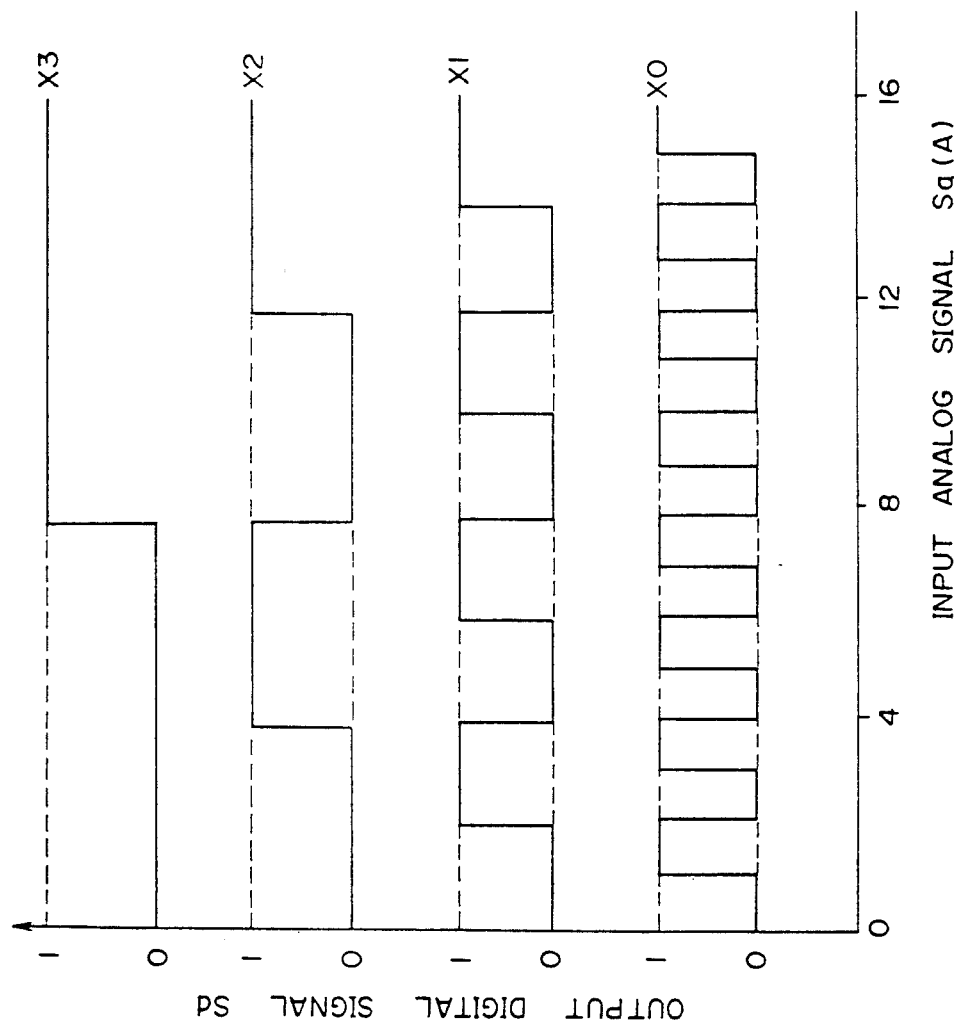

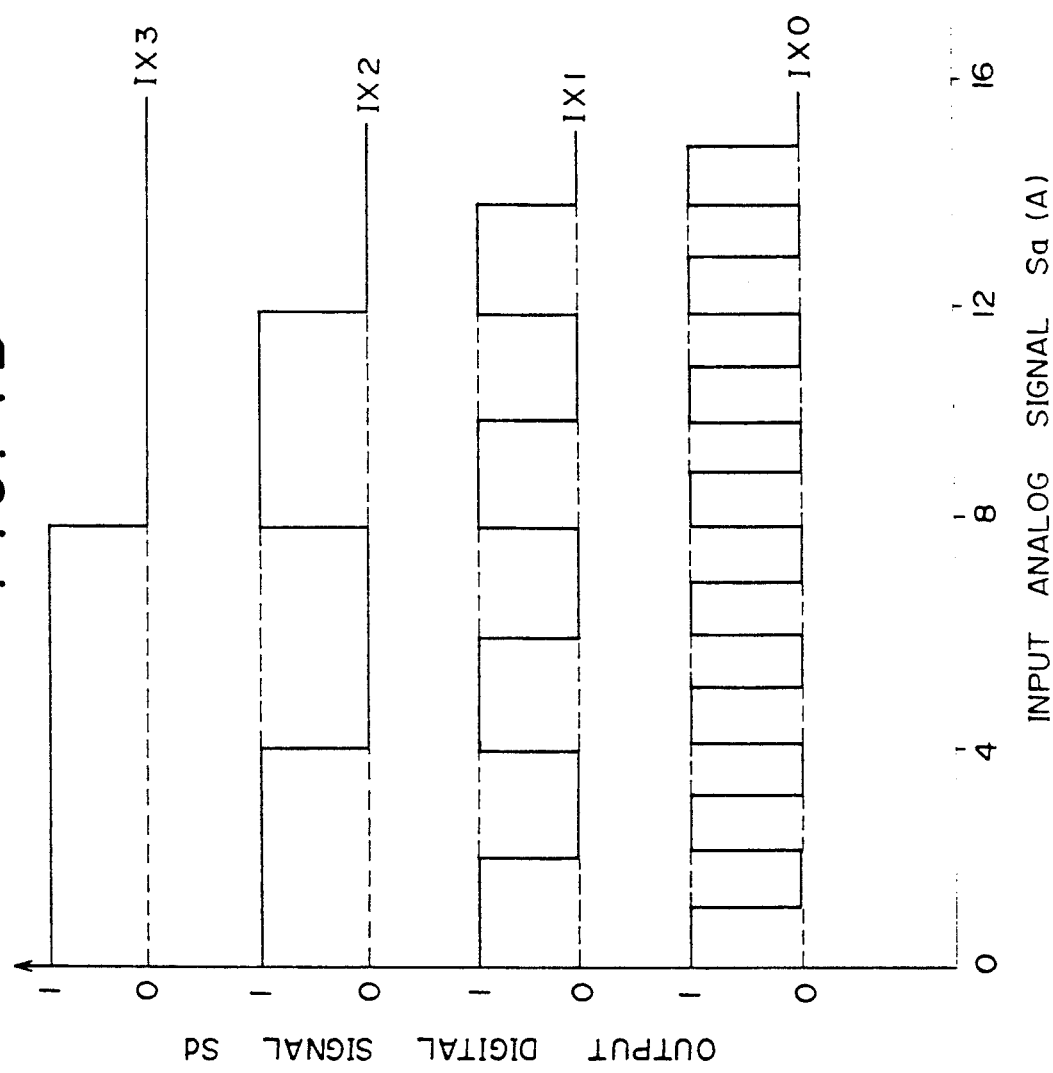

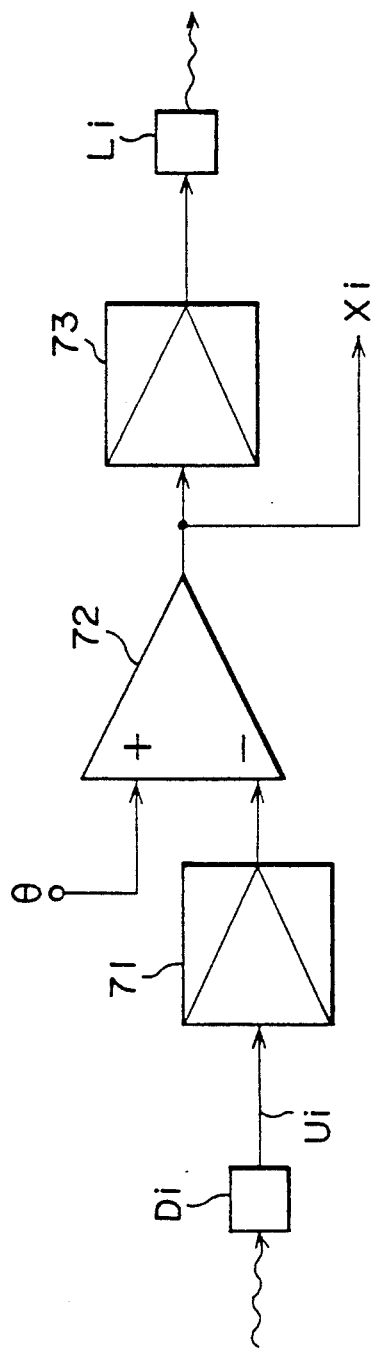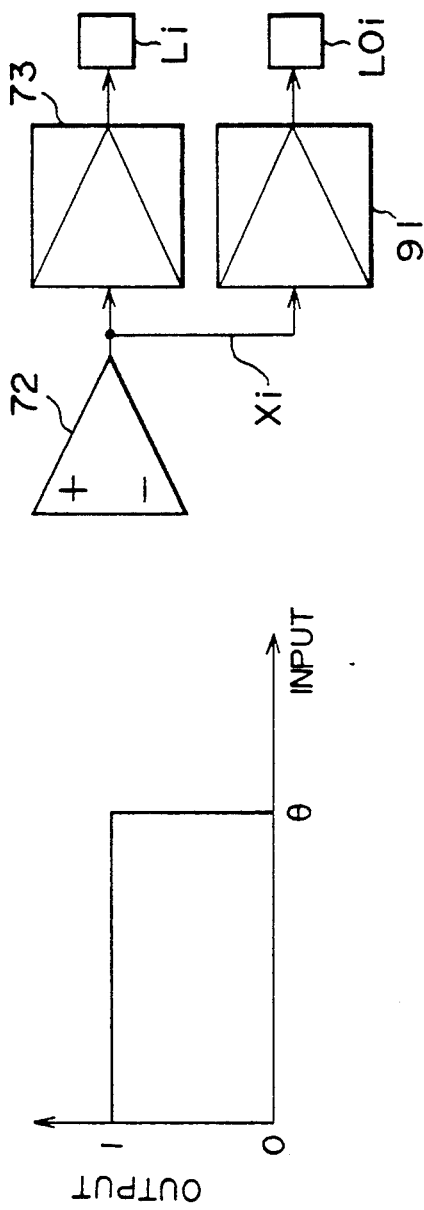

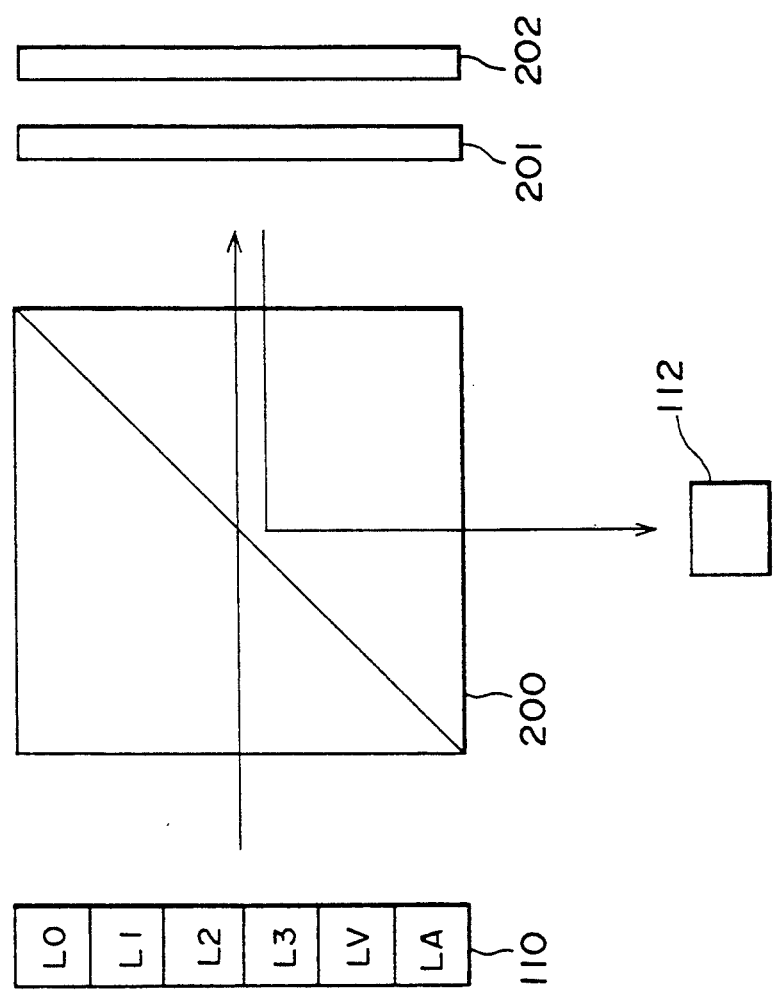

5,264,849

OPTICAL A/D CONVERSION USING ASYMMETRICAL-NEURAL-NETWORKS

BACKGROUND OF THE INVENTION

1. Field of the Invention

The present invention relates to an optical A/D-conversion method and apparatus using asymmetrical-neural-networks.

2. Description of the Related Art

Recently, an optical A/D-converter, and an optical A/D-converter using neural-networks have been proposed. Further, an electrical-wired-A/D-converter using asymmetrical-neural-networks has also been proposed. These proposed A/D-converters are introduced in sequence below.

(I) An optical A/D-converter (i) "An Optical Analog-Digital Converter-Design and Analysis", IEEE Journal of Quantum Electronics, vol. QE-15, No. 4, April 1987, written by Henry F. Taylor, senior member, IEEE, discloses an optical A/D-converter using channel wavequide interferometric modulators.

(ii) "2-Bit Gsample/s Electrooptic Guided-Wave Analog-to-Digital Converter", IEEE Journal of Quantum Electronics, vol, QE-18, No. 10, October, 1982, written by R. A. Becker and Fredrick J. Leonberger, discloses an electrooptic A/D-converter using a pulsed GaAlAs diode laser for sampling, a $LiNbO_3$ Ti-indiffused-wave-guide interferometric array for conversion, a $S_i$ APD, and special GHz $S_i$ integrated circuit for digital processing.

(iii) "An optical A/D converter", Japanese Laid-Open Patent Application No. 2-248935, laid open in October, 1990, an inventor of which is Taki, discloses an optical A/D converter using the known Faraday effect.

(iv) "Optical Analog to Digital Converter", U.S. Pat. No. 4,851,840, dated in July, 1989, an inventor of which is Alastair D. McAulay, Kettering, OH, discloses an optical A/D converter using a number of optical comparators, which number of comparators corresponds to digital number defined by an n-bit digital word.

(II) An optical A/D-converter using neural-networks

"Simple 'Neutral' Optimization Network: An A/D converter, Signal Decision Circuit, and a Linear Programming Circuit", IEEE Transaction on Circuits and Systems, vol. 33, No. 5, May, 1986, written by David Tank and John. J. Hopfield, discloses an optical A/D converter using a method of a so called "simulated annealing" for removing a problem caused by a so called "initial-value-depending property", which is involved in a so called symmetrical neural networks. The initial-value-depending property means that a result of A/D conversion depends on an initial-value given for a neural network calculation. Further, the simulated annealing takes much time so that A/D conversion takes much time.

(III) An electrical-wired-A/D-converter using asymmetrical-neural-networks (i) "Analysis of Correct Action Neural Network", NC89-27(1989)49 of IEICE Technical Report written by Koji Nakajima, et. al., both belonging to Research Institute of Electrical Communication, Tohoku University, discloses an electrical-wired-A/D converter using asymmetrical-neural-networks. The above mentioned initial-value-depending property can be removed in this A/D converter so that conversion speed can be improved.

(ii) "Implementation of a Class of Asymmetrical Neural Networks with Application to A-D Converter", February 1992, pp. 103–111, No. 2, Vol. J75-C-II, Transaction of IEICE, written by Shigeo Sato, et. al., belonging to Research Institute of Electrical Communication, Tohoku University, discloses an implementation of A/D converter using a so called "asymmetrical neural network" ( which term is used in contrast to the above mentioned term "symmetrical neural network" ) as an electrical integrated circuit.

The A/D converter disclosed in the above mentioned item (III), i) is only a model. That is, it has not been an actual version for actual use yet. One of the methods of realizing the above converter is to make the A/D converter with an integrated electronic device. A problem here is that a value of $W_{ij}$ as mentioned below, and other values used for a neural network calculation is needed to be precisely the desired values. The reason for this is that the neural networks calculations include calculations using analog values. On the other hand, it is not always necessary to consider these precise values for digital calculations.

For realizing the A/D converter comprising an integrated electronic device, it is necessary that resistors having highly-accurate fixed-resistance values, Or variable resistances comprising field effect transistors, are included in a monolithic circuit with a comparator, which circuit is used for a part of the neural network calculations.

Further, a correction process of the values of the $W_{ij}$ and other values is needed so as to make the value of the $W_{ij}$ and the other values be the desired values if the values of the $W_{ij}$ and other values shift slightly from the desired values. This can result due to aging of elements thereof, which produce the values of the $W_{ij}$ and the other values in the A/D converter, or due to errors created during the manufacturing stages of the elements.

However, it is difficult to realize that such resistances and field effect transistors should be included in a monolithic circuit as well as to perform such correction work of the values of the $W_{ij}$ and other values mentioned above. The reason for this difficulty is that it is difficult to make resistance values of resistors or field effect transistors be precisely the desired values.

SUMMARY OF THE INVENTION

An object of the present invention is to provide an optical A/D-conversion method and apparatus using asymmetrical-neural-networks.

To achieve this object, an A/D converter according to the present invention converts an analog signal having a value A into an n-bit digital signal. The A/D converter comprises:

optical calculation ( to be described later ) means for performing at least a part (2) of a calculation of a first predetermined equation (1) on the above-mentioned value A by means of light; and comparing means for performing at least a predetermined thresholding on a result of the above mentioned first predetermined equation (1); and the above mentioned first predetermined equation (1) being such that $$U_i = [\{\{\Sigma(W_{ij} \times X_j) + h_i\} \times V\} + A] \times S_i \ldots \quad (1);$$

The calculation of the above-mentioned first predetermined equation (1) being performed (i = 0, 1, ..., n−1) respectively;

the above mentioned $W_{ij}$ is 0 if (the above mentioned i) ≧ (the above mentioned j) ≧ 0, or −{2**j (referred to as a result of raising 2 to the the above mentioned jth power hereinafter)} if (the above mentioned j) > (the above mentioned i) ≧ 0;

The above mentioned hi is

−{2i (referred to as a result of raising 2 to the the above mentioned ith power hereinafter)} or −(2i−ε) (|ε| ≦ 1);

V and $S_i$ respectively have any desired positive values; the above mentioned Σ represents a summation of each expression following thereto (j = 0, 1, ..., n−1);

the above mentioned part (2) of the above mentioned first predetermined equation (1) being such that $$[\{\Sigma(W_{ij} \times X_j)\} \times V] \times S_i \ldots \quad (2);$$

the above mentioned predetermined thresholding involving that respective results U1 of each of the calculation of the above mentioned first predetermined equations (1) are respectively compared to a predetermined threshold value: a value 1 or 0 being then selected based on the results of the respective comparison; and respective one of results of the selection of each the above mentioned predetermined thresholding performed on each of said results $U_i$ being then assigned to respective one of the above mentioned $X_i$, the calculation of the above mentioned first predetermined equation (1) being then performed repeatedly using each of the above mentioned $X_i$ until respective ones of the above mentioned $X_i$ converge on respective solutions; respective the above mentioned solution of each the above mentioned $X_i$ where i goes from 0 to n−1, being then provided as respective digit a value of the above mentioned n-bit digital signal.

The above mentioned neural network calculations correspond to the asymmetrical neural network disclosed in the above mentioned reference item (III). Thus, erroneous results obtained by the A/D converter are prevented. Erroneous results may be obtained by the conventional A/D converter. This due to the above mentioned initial-value-depending property involved in the above mentioned symmetrical neural network calculations disclosed in the above mentioned reference item (II).

Further, the problem of preciseness of the $W_{ij}$ values and Other values, and the problem of the correction work as mentioned above can be overcome. This is because correction work as mentioned above is relatively easily performed by elements used in an an optical calculation. The elements used for performing an optical calculation are, for example, a filter as transmission means for transmitting light, LEDs, and photosensitive diodes. An adjustment method of a transmittance of the filter is, for example, variation of a transmittance of a liquid crystal contained in the filter.

Therefore, it is possible to provide an A/D converter offering quick and accurate results.

Other objects, features and advantages of the present invention will become more apparent from the following detailed description when read in conjunction with the accompanying drawings.

BRIEF DESCRIPTION OF THE DRAWINGS

FIGS. 1A and 1B show concepts of the present invention;

FIGS. 2A and 2B show a matrix of weights $W_{ij}$ involved in the present invention;

FIGS. 3A through 3E show illustrations for an explanation of an optical calculation involved in the present invention;

FIGS. 4A and 4B show values of bits that constitute four-bit digital signals converted from input analog values to digital values, at the input analog values;

FIG. 5A shows a concept, and FIGS. 5B through 5D show illustrations for an optical calculation means;

FIGS. 6A through 6C show illustrations for the explanation of a comparator device that constitutes a comparator part included in the embodiment shown in FIG. 5A, FIG. 6A is for a first embodiment of the present invention, and FIG. 6C is for a second embodiment of the present invention;

FIG. 10 shows an illustration for an explanation of an optical calculation means involved in a ninth embodiment of the present invention.

DESCRIPTION OF THE PREFERRED EMBODIMENT

Figure 3A:
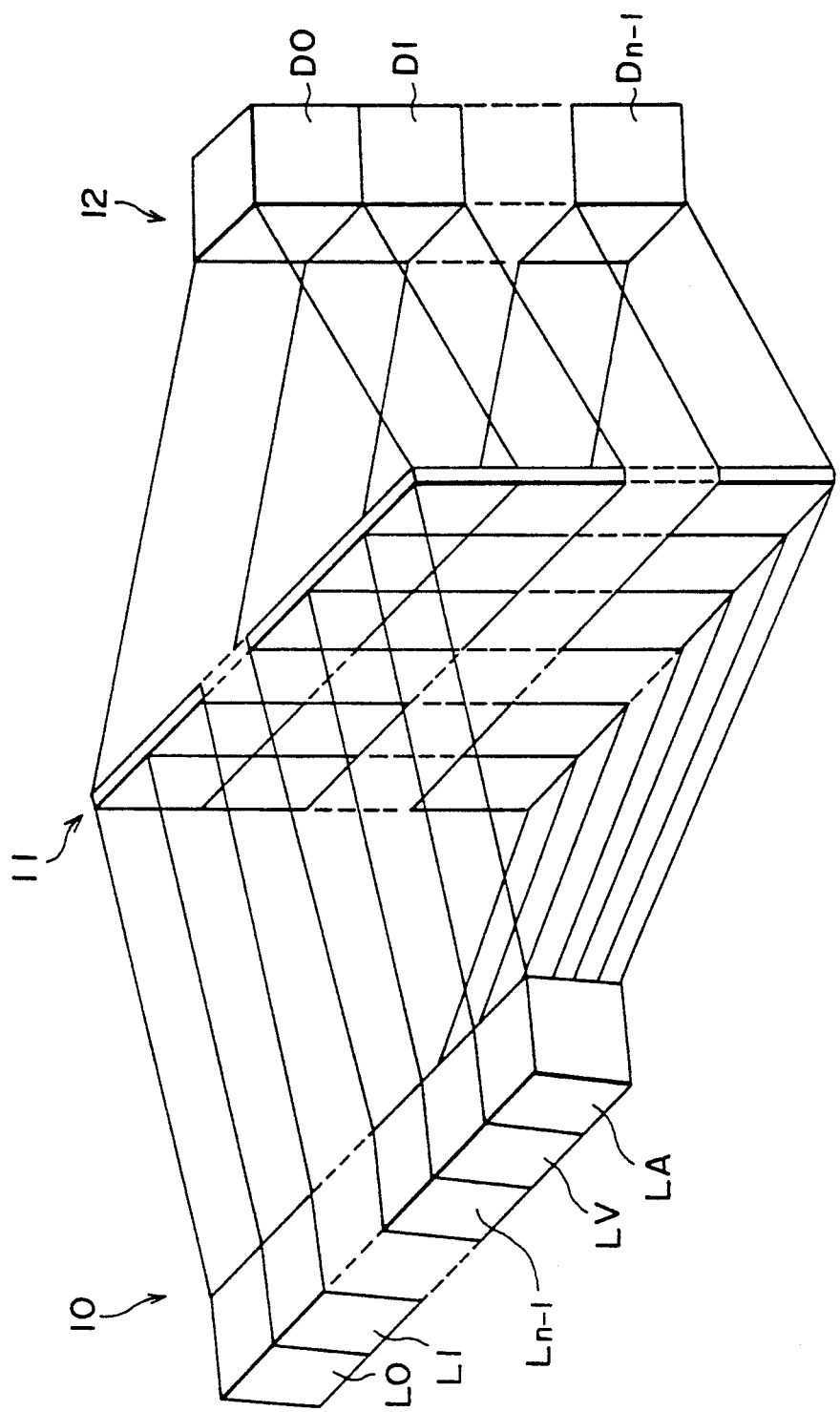

An optical A/D conversion according to the present invention involves conversion of an analog signal Sa having a value A into a digital signal Sd having n bits. An optical A/D converter comprises optical calculation means 1 and comparing means 2 as shown in FIGS. 1A and 1B. The optical calculation means performs a predetermined calculation by means of light as described below. These optical calculation means 1 and comparing means 2 constitute a feed back loop. The comparing means comprises x comparator devices, each of which corresponds to a respective one of n outputs supplied from the optical calculation means 1.

The above mentioned feed back loop performs the calculation of the above mentioned predetermined equation (1) on the above mentioned value A. The optical calculation means 1 at least performs the above mentioned part (2) of the equation (1). Further, the comparing means 2 at least performs the above mentioned predetermined thresholding on a result $U_i$ from 0 to n − 1 in i obtained from the calculation of the equation (1).

A respective result of each the thresholding performed on each result $U_i$ is then assigned to respective one of the above mentioned $X_i$. The calculation of the equation (1) is then performed repeatedly, using each of the $X_i$ obtained from the corresponding calculation of the equation (1) and the corresponding thresholding. This calculation repeated until the respective the above mentioned $X_i$ converge on respective solutions. The respective solution of each $X_i (i=0, 1, \ldots, m-1)$ is the provided as values of respective digits of the n-bit digital signal Sd.

The signal Sa may be supplied to either the optical calculation means 1 as shown in FIG. 1A or to the comparing means 2 as shown in FIG. 1B.

The value $S_i$ may be any desired positive real number, and may vary from $S_i$ to $S_i (i=0, 1, \ldots, n-1)$. However, for the sake of simplicity in an explanation hereinafter we will deal with the case where $S_i = 1$. Further, a value V is a reference input value used for adjustment Of a ratio of a digital Output Of the optical A/D converter to an analog input. This value V may be any desired value as mentioned above.

The equation (1) can be re-written as per the following equation (11).

$$U_i = \{\Sigma(W_{ij} \times X_j) \times V\} + (h_i \times V) + A \ldots \quad (11).$$

The above mentioned adjustment of a digital output scale can be performed by the following methods without variation of the weight $W_{ij}$. The first method is that a value of the $X_j$ is fixed at "0" or "1" and the $W_{ij}$ used results from an original $W_{ij}$ being multiplied by V. The second method is that a value of the $X_j$ is fixed at "0" or "V" instead of at "0" or "1" and no multiplication takes place.

The above mentioned predetermined thresholding performed on the result U of the calculation of the above mentioned equation (11) is described below. If $U_i < 0$, "0" is substituted for a respective $X_i$ used in the next calculation of the equation (11). On the other hand, if $U_i \geq 0$, the $X_i$ is substituted by "1".

Repeating the calculation of the equation (11) using each $X_i$ obtained from the corresponding calculation of the equation (11) and corresponding thresholding makes each $X_i$ converge. Each resulting $X_i$ corresponds to a value of a respective bit of the output digital signal Sd for the analog input value A of the signal Sa.

A reason is described below concerning why a neural network involving the calculation of the above mentioned predetermined equation (1) is called an "asymmetrical neural network". If the above mentioned weights $W_{ij}$ from $i=0$ to $i=n-1$ and from $j=0$ to $j=n-1$ are arranged as a matrix, the matrix is an asymmetrical matrix such that diagonal elements and elements located in the left lower side with respect to the diagonal elements of the matrix are "0" as shown in FIG. 2B. The matrix has an arrangement such that the $W_{ij}$ from $j=0$ to $n-1$ are all located in a respective row of the matrix in a direction from left to the right for each i, and the $W_{ij}$ from $i=0$ to $n-1$ are all located in a respective column of the matrix in a direction from the top to the bottom for each the j as shown in FIG. 2A. A neural network involving such weights $W_{ij}$ can result in removal of the problem caused by the initial-value-depending property involved in the conventional A/D converter as mentioned above.

Both the value $W_{ij}$ and the value hi are "0" or negative values as mentioned above. On the other hand, the value A is a positive values. Thus, the calculation of the equation (1) includes subtraction. This subtraction calculation cannot, in principle, be performed by means of the optical calculation means 1. This is because ( incoherent ) light can not represent a negative value. Thus, some implementation is needed for overcoming the problem of difficulty in performing the calculation by means of an optical calculation means. Such an implementation is needed if the signal Sa is supplied into the optical calculation means 1 as shown in FIG. 1A.

The first method for overcoming the above equation (11) is modified to the following equation (12) where we let V = 1 for simplicity for explanation.

$$U_i = -\{\Sigma(|W_{ij}|'X_j) + |h_i| + \theta - A\} + \theta \ldots \quad (12).$$

$\theta$ is obtained by $(2**n) - 1$.

Then a result YA is obtained by a complement calculation such as $$YA = \theta - A.$$

Thus, a calculation of the following equation (13) is performed on the YA.

$$YU_i = \Sigma(|W_{ij}| \times X_j) + |h_i| + YA \ldots \quad (13).$$

Thus the result $YU_i$ of the calculation of the equation (13) is obtained. Then a predetermined thresholding is performed on the $YU_i$. the predetermined thresholding involves that if $YU_i \leq \theta$, then $X_i = 1$, or if $YU_i > \theta$, then $X_i = 0$.

Then each result $X_i$ is obtained from repeating the calculation of the above mentioned equation (13) and the thresholding following the calculation Of (13), using each $X_i$ obtained from the corresponding calculation of the equation (the word "equation" will be omitted for the sake of simplicity hereinafter ) (13) and the corresponding thresholding, until each $X_i$ converges on a respective value.

The resulting $X_i$ obtained from the following calculation and thresholding are the normally resulting $X_i$. The calculation of the above mentioned (11) is performed with the V=1, then a thresholding is performed on a result $U_i$ of the calculation of (11), and the thresholding involves that if $U_i < 0$, then $X_i = 0$, or if $U_1 \geq 0$, then $X_i = 1$.

The second method for overcoming the above mentioned problem is described below. A calculation of the following (4) is performed on the value A of the input analog signal Sa.

$$Zu_i = \Sigma(|W_{ij}| \times X_j) + |h_i| + A \ldots \quad (14).$$

The result $ZU_i$ is obtained by means of the calculation of (14). A thresholding is performed on the $ZU_i$. The thresholding involves that if $Zu_1 \leq \theta$, then $X_i = 1$, or if $Zu_i > \theta$, then $X_i = 0$.

Then each result $X_i$ obtained as a result of repeating the above mentioned calculation of (14) and the thresholding following the calculation (14), using each $X_i$ obtained from a corresponding step of calculation of (14) and the thresholding following the calculation of (14).

However, the results $X_i$ in this second method have respective values inverted from values of the above mentioned normal results $X_i$ of the first method. The above mentioned term "invert" means that each value of the $X_i$ is changed from "1" to "0" or from "0" to "1". An output digital signal Sd comprises bits, values of which are the results $X_i$ of the second method, which values are inverted from values of a normal output digital signal Sd comprising bits, values of which are the normal results $X_i$ of the first method.

The normal results $X_i$ of the first method can be obtained respectively from inverting of values of the results $X_i$ of the second method by an inverting means, the $X_i$ having been obtained as a result of above mentioned calculation of (14) and the thresholding following the calculation of (14). Then, the normal digital signal Sd can be obtained.

For simplicity of explanations, the symbol "A" hereinafter represents not Only the value A itself but also the value YA. Further, the symbol "$U_i$" represents not only the value $U_i$ itself but also $YU_i$ or $ZU_i$ hereinafter.

A conception of the above mentioned optical calculation means, which performs the calculation of (13) or (14), is described below in conjunction with FIGS. 3A through 3E. The optical calculation means comprises an emission array 10, a transmission means 11, and a photosensitive means 12 as shown in FIG. 3A.

Figure 3B:

The emission array comprises n+1 emission elements L0, L1, L2, ..., $L_j$, ..., L(n−2), L(n−1), LV, and LA, which are provided along a row so that adjacent elements are in contact with each other, as shown in FIG. 3B. The arrangement of the emission array in FIG. 3B shows a side of the emission array the reverse of a side facing the transmission means 11, that is, the left side in FIG. 3A.

The transmission means 11 comprises a two-dimentional matrix of transmission areas. The matrix has an arrangement of the transmission areas such that n+1 transmission areas $T_i0$, $T_i1$, $T_i2$, ..., $T_{ij}$, ..., $T_i(n-2)$, $T_i(n-1)$, $T_iV$, and $T_iA$ are located in each row of the matrix so that adjacent areas are contact with each other along a row extending in the same as the above row of the emission array 10. On the other hand, n transmission areas $T0_j$, $T1_j$, $T2_j$, ..., $T_{ij}$, ..., and $T(n-1)$ are located in each column of the matrix so that adjacent area are in contact with each other in a column extending in a direction perpendicular to that of the above mentioned row of the matrix, as shown in FIG. 3C.

Figure 3D:
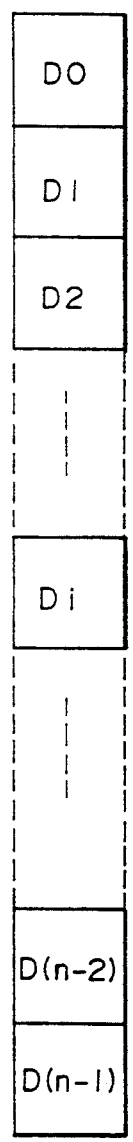

The photosensitive means 12 comprises n photosensitive elements D0, D1, D2, ..., $D_i$, ..., and D(n−1) are located so that adjacent elements are contact with each other in a column extending in the same as the column of the matrix of the transmission means 11 as shown in FIG. 3D.

Figure 3E:
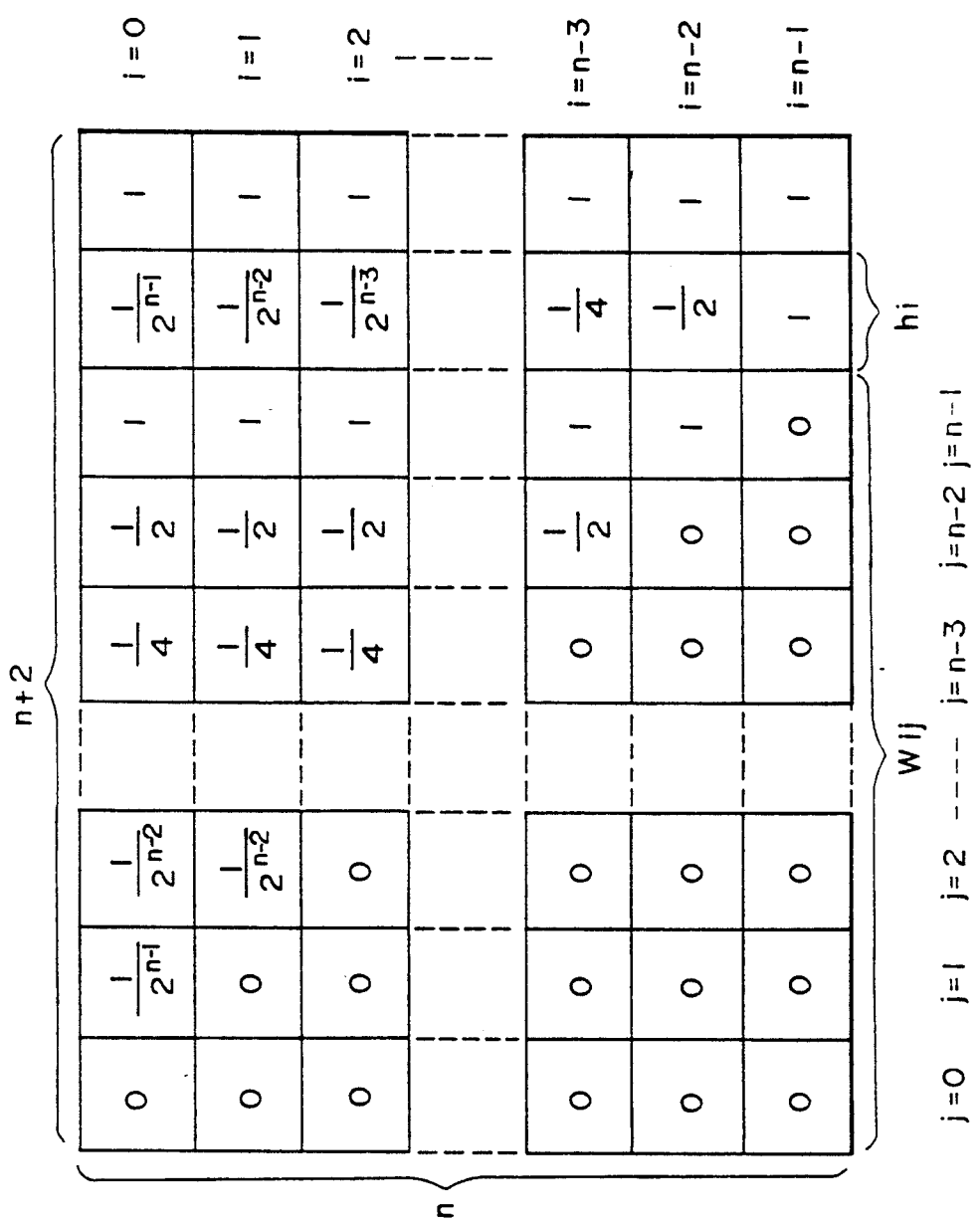

Each transmission area of the transmission means 11, which area has a rectangular shape, has respective transmittance. Transmittance values are predetermined as shown in FIG. 3E. The arrangement of the transmission areas in FIGS. 3C and 3E shows a side of the transmission means 11 facing the emission means 10, that is, the left side in FIG. 3A.

The transmittances of the areas Of the columns located in positions from the leftmost one to the nth one away therefrom respectively correspond to the above mentioned weight "$W_{ij}$". The transmittances Of areas of the column the (n+1)th from the leftmost one respectively correspond to the above mentioned "$h_i$". The transmittances of the areas of the rightmost column are respectively "1".

That is, if light applied to the transmission means 11, which light has intensity "1" uniform with respect to the area perpendicular to the light emitting direction, the intensities of light transmitted through each area of the transmission means 11 are $|W_{ij}|$, $|h_i|$ and "1" respectively in the above mentioned calculation of (13) or (14).

The emission elements L0, L1, L2, ..., L(n−1) respectively correspond to the above mentioned values $X_i$ from i=0 to n−1 in the calculation of *13), or (14), that is, X0, X1, X2, ..., X(n−1). The element LV corresponds to the above mentioned reference value V in the calculation of (13) or (14)( with V=1 in the calculations ). The element LA corresponds to the above mentioned value A of the analog input Sa.

Each emission element emits, corresponding to an input electric signal, light to be applied to the transmission means 11. The input electric signals respectively correspond to the above values X0, X1, X2, X(n−1), V, and A. This method enables the intensities of light emitted from the elements L0, L1, L2, ..., L(n−1), LV, and LA to be in proportion to the values X0, X1, X2, X(n−1), V, and A respectively. Another method is possible such that light signals having such intensities are applied to the transmission means 11 directly from outside instead of using such emission means 10.

Further, light-direction-control means, not shown in FIG. 3A, is provided for the optical calculation means. The light-direction-control means controls a direction of respective light emitted from each emission element of the emission means 10. This is so that respective light emitted from each emission element L0, L1, L2, ..., LV, and LA may be applied to respective columns of said transmission areas $T_i0$, $T_i1$, $T_i2$, ..., $T_iV$, and $T_iA$ from i=0 to n−1, as shown in FIG. 3A. That is, for example, the light emitted from the element L0 is applied to the column of the areas T00, T10, T20, ..., $T_i0$, and T(n−1)0.

The light-direction-control means also controls a direction of light transmitted through each the transmission means 11. This is so that respective light transmitted through each row of the matrix of the transmission areas $T0_j$, $T1_j$, $T2_j$, ..., $T_{ij}$, ..., $T(n-1)j$ from j=0 to n respective ones of the photosensitive elements D1, D1, D2, ..., D(n−1) as shown in FIG. 3A. That is, for example, the light transmitted through the row of areas T00, T01, T02, ..., $T0_j$, ..., and $T(n-1)j$ is applied to the element D0.

Further, the outputs obtained from the elements D0, D1, D2, ..., D(n−1) are respectively in proportion to the intensities of light, applied to them. Thus, the outputs obtained from the elements D0, D1, D2, ..., D(n−1) are respectively in proportion to the result $YU_i$ from i=0 to n−1, that is, YU1, YU2, YU3, ..., YU(n−1), or $ZU_i$ from i=0 to n−1, that is, ZU1, ZU2, ZU3, ..., ZU(n−1) of the above mentioned calculation of (13) or (14).

Results of an A/D conversion using example calculations of (13) and (14) are described below in conjunction with FIGS. 4A and 4B. Conditions of the calculations of this example are n=4, and θ=15.

FIG. 4A shows the result of the A/D conversion using the example calculation of (13). In the calculation of (13), a value XA was obtained from the above mentioned complement calculation θ−A, which was performed on a value A of the input analog signal Sa previously of the optical calculation of (13). The values Of X0 through X3 are for bits of the output digital signal Sd. This results from the repetition of calculation of (13) accompanied by the thresholding until each $X_i$ converges on a certain value. FIG. 4A shows that the values X0 through X3 respond normally to an increase of the value A of the input analog signal Sa. For example, Sd(X3, X2, X1, X0)=(0, 1, 0, 0) at Sa=4; Sd(X3, X2, X1, X0)=(1, 0, 0, 0) at Sa=8; Sd (X3, X2, X1, X0)=(1, 1, 0, 0) at Sa=12.

In FIG. 4B shows the result of an A/D conversion using the example calculation of (14) of the example, that is, a value A that is directly used in the optical calculation of (14) without a complement calculation such as above. The values of IX0 through IX3 are for bits of the output digital signal Sd. This results from the repetition of the calculation of (14) accompanied by the thresholding until each $X_i$ converges to a certain value. The FIG. 4B shows that the responses of the values IX0 through IX3 to an increase of the value A of the input analog signal Sa is such that values of the IX0 through IX3 are respectively inverted from normal values thereof, which normal values thereof are the X0 through X3 in FIG. 4A. For example, Sd(X3, X2, X1, X0) =(1, 0, 1, 1) at Sa=4; Sd(X3, X2, X1, X0)=(0, 1, 1, 1) at Sa=8; Sd (X3, X2, X1, X0)=(0, 0, 1, 1) at Sa=12.

A concept of first embodiment of the present invention is described below with reference to FIG. 5A. This embodiment is of an A/D converter for converting a value A of an input analog signal Sa into 4-bit Output digital signal Sd.

The A/D converter comprises a light-emission-element element array ( "LED array" hereinafter )110, a two-dimensional array transmission part 115, a photosensitive-element array ( "PD array" hereinafter 112, and a comparator part 114. The LED array 110, the transmission part 115, and the PD array 112 constitute an optical calculation means.

The LED array 110 comprises six light emitting diodes, provided so that adjacent ones are in contact with each other along a row. Each light emitting diode is 5 millimeters in element size, and includes a lens.

The PD array 112 comprises four photodiodes which are provided so that adjacent ones are in contact with each other along a column. Each photodiode is 5 millimeters in element size, and can emit light in the visible spectrum.

A construction of the optical calculation means given below with reference to FIGS. 5B and 5C. FIG. 5B shows the construction from a view point along a direction of the column of the elements of the PD array 112. FIG. 5C shows the construction with a view point along a direction of the raw of the elements of the LED array 110. The transmission part 115 comprises a shadowing mask plate 111A, and lenses 51, 52, 53, and 54.

The lens 51 comprises a cylindrical lens, and the lens 52 comprises a spherical lens. These lenses constitute an anamorphic-inverting-image system. This system makes light emitted from the LED array 110 spread with respect to a longitudinal direction of the PD array 112, that is, a direction from the top to the bottom in FIG. 5C. This system also makes the light be inverted with respect to a longitudinal direction of the LED array 110, that is a direction from the top to the bottom in FIG. 5B. As a result of these spreading and being inverted, the system forms an image on the shadowing mask plate 111A. The arrangement of elements on the shadowing mask plate 111A should be inverted compared to that of the LED array 110 in consideration of the inversion of light by the above mentioned system.

The lens 53 comprises a cylindrical lens, and the lens 54 comprises a spherical lens. These lenses also constitute an anamorphic lens system. However, this system is an image-erecting system. The light transmitted through the shadowing mask plate 111A is shrunk with respect to a longitudinal direction of the LED array 110 by means of the system of the lenses 53 and 54, that is, the image is shrunk with respect to a direction from the top to the bottom in FIG. 5B. Thus, this system of lenses 53 and 54 forms an image on the PD array 112.

A construction of the shadowing mask plate 111A is described below with reference to FIG. 5D. The shadowing mask plate 111A has rectangularly shaped openings. The areas of the openings are shown hatched in FIG. 5D.

Constructions of the openings are described below. These openings respectively correspond to the above mentioned transmission areas $T_{ij}$, $T_iV$, and $T_iA$. The transmission areas $T_{ij}$ correspond to the weight $W_{ij}$ as mentioned above. Light corresponding to the above reference value V is applied to the areas $T_i$ V. Light corresponding to the above value A of the input analog signal Sa is applied to the area $T_iA$.

The openings T01, T02, T03, T12, T13, and T23, which correspond to the $W_{ij}$ having values other than "0", and the Openings T0A, T1A, T2A, and T3A, which are applied light corresponding to the value A, are respectively rectangularly shaped openings. Each opening is 2 millimeters in a vertical dimension and 4 millimeters in a horizontal dimension. The term "vertical" means a direction from the top to the bottom in FIG. 5D, and the term "horizontal" means a direction from the left to the right in FIG. 5D.

The remaining openings T0V, T1V, T2V, and T3V are located, respectively, from the first row to the fourth row of the matrix of the transmission areas. Light of intensity corresponding to the value V is applied to these openings. These openings are rectangularly shaped. The vertical dimension of each of these openings is respectively 2 millimeters. The horizontal dimensions of these T0V, T1V, T2V, and T3V are, respectively, 0.5 millimeter, 1 millimeter 2 millimeters, and 4 millimeters.

Further, the positions corresponding to T00, T10, T11, T20, T21, T22, T30, T31, T32, and T33 do not have any opening. This is because these positions correspond to the $W_{ij}$ having value of "0".

Pitches Ph in the horizontal direction between each opening are respectively 10 millimeters. Pitches Pv in the vertical direction are respectively 5 millimeters. The dimensions of each pitch Pv are the same as that of the pitches Pd of the photodiodes of PD array 112. These pitch dimensions Ph, Pv, and Pd result in the prevention of a cross talk phenomena. The cross talk phenomena involves cross talk of incident light among photodiodes of the PD array 112.

The shadowing mask plate 111A can be realized by, for example, a photo mask for lithography, wherein transparent windows are provided on a black background of the photo mask.

Some of the weights $W_{ij}$, having the same value of j and which weights $W_{ij}$ are non zero, have identical values, as shown in FIG. 3E. On the other hand, some of the weights $W_{ij}$, having different values of j, and which weights $W_{ij}$ are non zero, have values different from each other, as shown in FIG. 3E. Thus, it is necessary that the light intensities emitted from some Of the light emitting diodes L0, L1, L2, and L3 of the emission array 110, which diodes correspond to the different j, are respectively weighted so as to be in proportion to the values of the $W_{ij}$. The above mentioned light intensities emitted from the light emitting diodes are for such condition as for example when the light emitting diodes are emitting under the input of a logic value "1". Further, it is also possible to determine the areas of the openings that correspond to the $W_{ij}$, so as to provide them in proportion to the values of the correspond $W_{ij}$. In this case, the intensities of light emitted by the light emitting diodes are identical.

Further, the light intensity emitted from the light emitting diode LV, which corresponds to the above mentioned reference input value V, is predetermined to be "1". Thus, the above mentioned calculations of (13) and (14) can be performed by means of the optical calculation means described above.

The comparator part 114 comprises four comparator devices 114-i, that is, 114-0, 114-1, 114-2, and 114-3. Outputs $U_i$, that is, U0, U1, U2, and U3 of the PD array 112 are respectively supplied to these comparator devices 114-0 through 114-3 as shown in FIG. 5A. Each comparator device 114-i performs a thresholding such as shown in FIG. 6B on each input $U_i$ so as to provide output $X_i$, that is, X0, X1, X2, and X3. Such thresholding involves that if $U_i \leq \theta (=15)$, then $X_i = 1$, or
if $U_i \theta$, then $X_i = 0$.

Figure 5A:
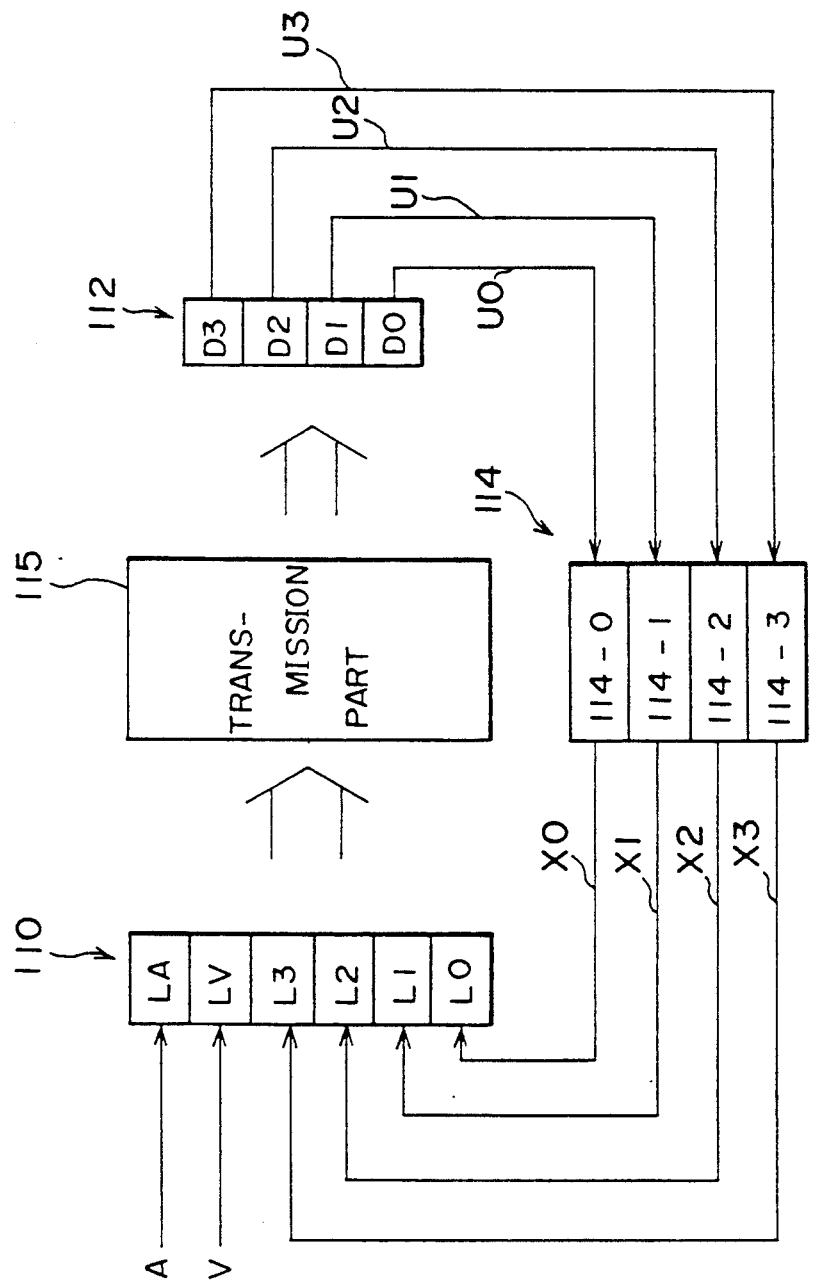
FIGS. 5A through 5D show composition and construction of embodiments of the present invention.
Figures 5B, 5C:
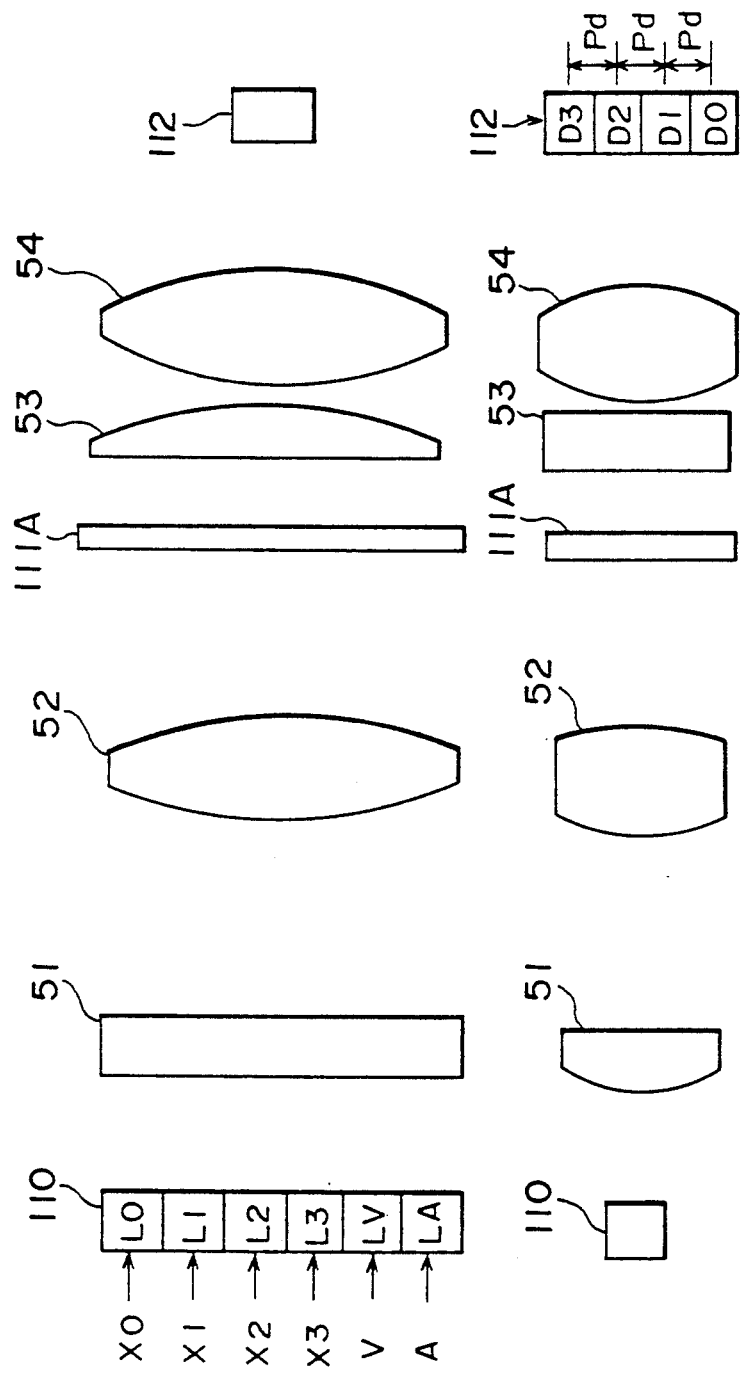

These outputs $X_i$ are then respectively supplied to the light emitting diodes $L_i$, that is, L0, L1, L2, and L3 as shown in FIG. 5A. Thus, the light emitting diodes L1 emit light as a result of converting the inputs $X_i$ into light having the corresponding intensities.

Results obtained from the asymmetrical neural network calculation do not depend on the initial values, as mentioned above. Thus, initial values of the $X_i$ can be predetermined to be any desired logic values. That is, for example, all $X_i$ may be determined to be the logic value "1".

One example of a composition of the comparator devices 114-i, which devices are applied to the first embodiment of the present invention, is described below with reference to FIG. 6A. A comparator device 114-i of the example comprises an amplifier 71, a comparator 72, and an amplifier 73. An outputs $U_i$ of the photodiode $D_i$ is amplified by the amplifier 71, and is supplied to an inverting input terminal (−) of the comparator 72. The threshold value $\theta$ is provided to a non-inverting input terminal (+) of the comparator 72. The comparator 72 compares the input $U_i$ with the threshold value $\theta$ so as to provide an output in accordance with FIG. 6B. That is, in accordance with the above mentioned thresholding.

The output is amplified by means of the amplifier 73. A signal, obtained as a result of this amplifying is supplied to the corresponding light emitting diode L1 of the LED array 110. On the other hand, the comparator 72 provides a bit value that constitutes the output digital signal Sd. This provision is done after the values $X_i$ converge as a result the repetition of the calculation of (13) or (14) and the thresholding as mentioned above, in the feed back loop as shown in FIG. 5A.

The output $U_i$ of the optical calculation mean is converted into a voltage signal by the amplifier 71. Thus, the input of the comparator 72 may be used for the base of the adjustments of the light intensity Of the light emitting diode of the LED array 110 and a sensitivity of the photodiode of the PD array 112.

The output digital signals Sd obtained by the A/D converters above described are shown in FIGS. 4A, and 4B. FIG. 4A shows the output Sd obtained from the method of the calculation of (13). That is, a complement calculation, such as $\theta - A$, has been performed on the value A of the input analog signal Sa previously of the calculation of (13) as mentioned above.

FIG. 4B shows output Sd obtained form the other method of calculation of (14). That is, the above mentioned complement calculation has not been performed on the value A, rather the value A has been directly used in the calculation of (14).

The digital Output Sd obtained by the above mentioned example of the A/D converter comprises a group of the electric signals $X_i$. However, the digital signal Sd, which comprises a group of optical signals, can be also available.

The light emitting diodes $L_i$ in the above mentioned example emit light, intensities of which are respectively in proportion to the weights $W_{ij}$. In order to do this, the light intensities emitted from some of the light emitting diodes L0, L1, L2, and L3 of the emission array 110, which correspond to different i, are respectively weighted so as to be in proportion to the values of the "$W_{ij}$ with the condition that the inputs $X_i$ are respectively " 1" in logic values as mentioned above. For the purpose of this weighting of the light intensities, it is necessary that each amplification rate of the amplifier 73 should be predetermined to be in proportion to the corresponding weight $W_{ij}$.

Thus, the optical signals obtained from the light emittance diodes $L_i$ correspond to values that are results of amplification of $X_b$ by the amplifers 73, which amplifiers have different amplification rates from each other.

Addition of an amplifier 91 and a light emitting diode $L0_i$ to each comparator device 114-i, as shown in FIG. 6C, overcomes the above mentioned problem. FIG. 6C shows a part of a second embodiment of the present invention. The only point of difference between the second embodiment and the first embodiment is a part shown in FIG. 6C.

The output $X_i$ from the comparator 72 is amplified by the amplifier 91, and the result of the amplification is then provided to the light emitting diode $L0_i$, which is only used for the output. Amplification rates of the amplifiers 91 are identical for all comparator devices 114-$i$.

On the other hand, if the areas of the opening are predetermined, which areas correspond to the $W_{ij}$ so as to be in proportion to the values of the corresponding $W_{ij}$ and, as in the present case, the intensities of light, emitted from the light emitting diodes, can be identical, as mentioned above, the following method is possible. That is, the amplification rates of the amplifiers 73 of all comparator devices 114-$i$ can be identical. In this case, the optical digital output Sd can be obtained as a result of providing the $X_i$ of FIG. 6A to the light emitting diode used only for output, and which diode is other than the light emitting diode $L_i$ of the LED array 110.

The above mentioned calculations of (13) and (14) are performed by means of the optical calculation in the embodiments mentioned above. Thus, the value A of the input signal Sa is converted into an optical signal by means Of the LED array 110. This method is represented as shown in FIG. 1A. However, another method, such as that shown in FIG. 1B, is also possible in the present invention. The method comprises that the input signal Sa is provided to the comparator 72.

Figure 7:
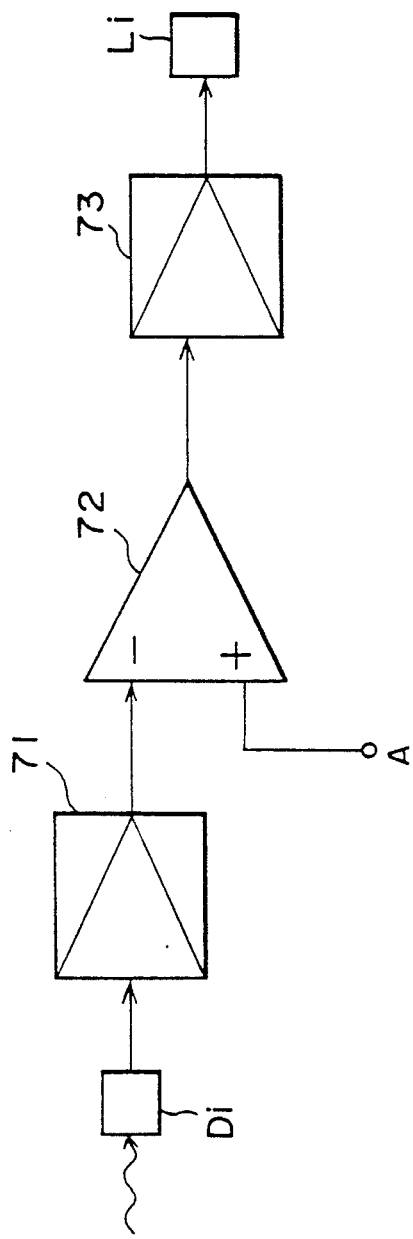
FIG. 7 shows a feature of a third embodiment of the present invention.

A third embodiment of the present invention, which uses this method, is described below with reference to FIG. 7. FIG. 7 shows only an essential part of the construction of the third embodiment. A composition of the embodiment, not shown in FIG. 7, is described below.

The embodiment comprises the composition shown in FIG. 5A, but the light emitting diode LA, which is used for emission of light corresponding to the value A of the input signal Sa, is omitted from the composition.

The value A is respectively supplied to non-inverting terminals (+) of comparators 72 of all comparator devices 114-$i$ as shown in FIG. 7. The value A is supplied to the terminals (+).

Figure 8:
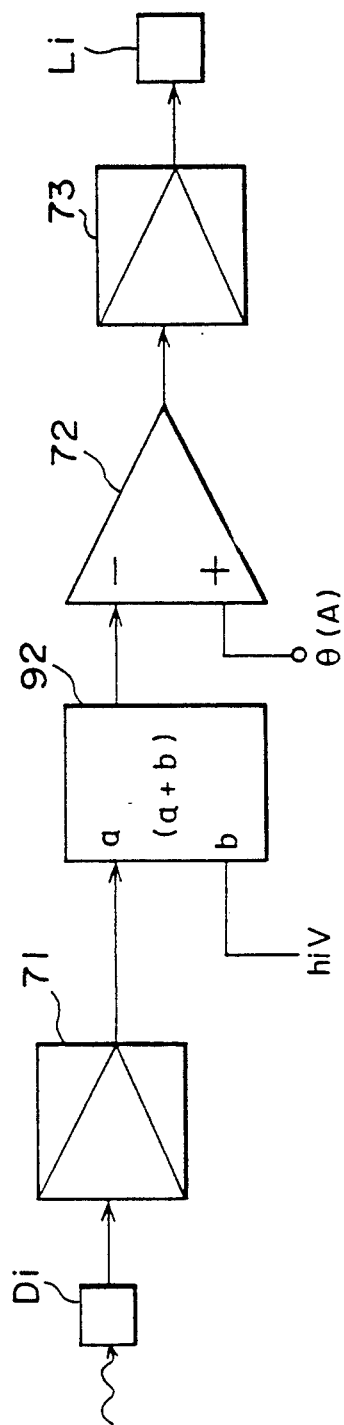
FIG. 8 shows a feature of fourth or fifth embodiment of the present invention.

A fourth embodiment of the present invention is described with reference to FIG. 8. FIG. 8 shows an essential part of this embodiment. The fourth embodiment is obtained as a result of a modification of the third embodiment. The term $h_i \times V$ from the above mentioned calculation of (11) is supplied electrically to the A/D converter. That is, an adder 92 is inserted between the amplifier 71 and the comparator 72 of the composition of FIG. 7 for each of the comparator devices 114-$i$ as shown in FIG. 8.

The output of the amplifier 71 is provided to the "a" input of the adder 92, and the calculation term $h_i \times V$ is provided to the "b" input, electrically. The adder adds them together electrically, and the result of this addition is supplied to the inverting terminal (−) of the comparator 72. The value $\theta$ is provided to the non-inverting terminal (+).

The light emitting diode LA of the LED array 110 in FIG. 6, used for provision of the value A, is Omitted in the fourth embodiment.

A fifth embodiment of the present invention is described below. The fifth embodiment is obtained through modification of the fourth embodiment. Parts of the fifth embodiment that involve points of difference between the fourth and the fifth embodiments, are described below. The light emitting diode LV is omitted from the composition of FIG. 6 in addition to omitting the LA. A second difference is that the value A is provided to the non-inverting terminal (+) of the comparator 72.

Both the term $h_i V$ and the value A are electrically input to the A/D converter of the fifth embodiment as mentioned above. Thus, the optical calculation means performs only the first term of the calculation of (11). This means that the optical calculation means is not needed to perform any subtraction calculations. Thus, the feed back loop as shown in FIG. 5A can perform the calculation of (11) directly. Thus, the threshold value can be determined to be "0", which value is used for performing the thresholding on the result $U_i$ of the calculation of (11). This is a reason why it is sufficient to supply only the value A to the non-inverting terminal (+) in the fifth embodiment.

It is possible through a modification in the third, fourth, and fifth embodiments as a result of performing a modification to obtain an optical signal output from an A/D converter, as mentioned above. The modification is as shown in FIG. 6C, as mentioned above.

The optical calculation means included in the above mentioned first through fifth embodiments respectively comprise a one-dimensional LED array 110, a two-dimentional array transmission part 115, and a one-dimentional PD array 112. However, the optical calculation means of an A/D converter can comprise a two-dimentional LED array and a one-dimentional PD array instead.

Figures 9A, 9B:
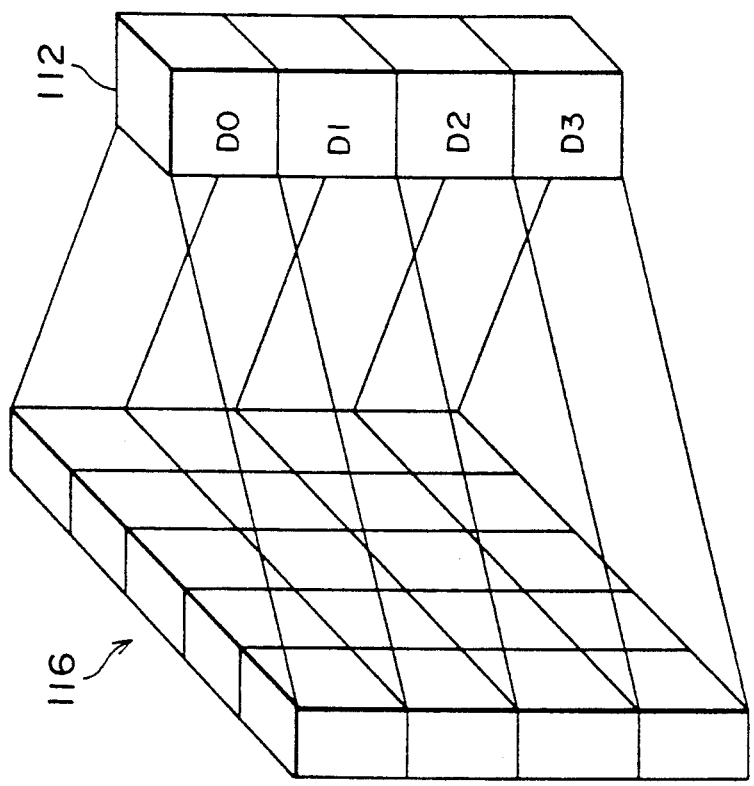
FIGS. 9A and 9B show illustrations for an explanation of an optical calculation means involved in a sixth embodiment of the present invention.

A sixth embodiment of the present invention is described below with reference to FIG. 9A. The sixth embodiment is obtained through a modification of the above mentioned first embodiment as shown in FIGS. 5A through 6A. A part of the sixth embodiment different from the first embodiment is described below. This difference consists in that an optical calculation means of the sixth embodiment comprises a two-dimentional LED array 116 and a one-dimentional PD array 112. The following construction is needed for a practical use of the embodiment. The above mentioned lenses 53 and 54, as shown in FIGS. 5B and 5C, are provided between the LED array 116 and the PD array 112.

A construction of the LED array 116 is described below with reference to FIG. 9B. Twenty light emitting diodes are arranged as shown in FIG. 9B. Light emitting diodes corresponding to inputs X1, X2, and X3 respectively emit light of intensities in the ratio 2:4:8 if they are given an identical input "1" in a logic value: these diodes are located in three columns, from the right most to the third column from the right in FIG. 9B. However, light emitting diodes "LEDs" hereinafter ) located in the most right column other than the top LED, LEDs located in the second column from the rightmost one other than the top two LEDs, and LEDs located in the top of the column third from the rightmost one do not emit any light. These unused LEDs can be omitted. An LED corresponding to an input X0, which corresponds to the weight $W_{ij}$ having the value "0", have been already omitted for the same reason.

A column of LEDs corresponding to the value A of the analog input Sa respectively emit light in proportion to the value A. This column is the leftmost column of FIG. 9B.

A column Of LEDs corresponding to the term $h_i V$ respectively emit light respectively in proportion to the values V, $2 \times V$, $4 \times V$, and $8 \times V$ in that order.

A seventh embodiment of the present invention is described below with reference to FIG. 9C. The seventh embodiment is obtained through a modification of the sixth embodiment. A part in the seventh embodiment involving a difference between the sixth embodiment and the seventh embodiment is described below.

The LED columns corresponding to the inputs X1, X2, X3, and A other than the above mentioned unused LEDs, are formed as described below. One LED is used for each column, although each LED mentioned respective corresponds to four LEDs in the sixth embodiment. Further, positions on the LED array 116 that correspond to the above mentioned unused LEDs, are covered by shading masks (Ms). These positions are performed hatching in FIG. 9C.

An eighth embodiment of the present invention is described below with reference to FIG. 9D. The eighth embodiment is obtained through a modification of the sixth and seventh embodiments as shown in FIGS. 9A through 9C. A part of the eighth embodiment involving a difference between the sixth or seventh embodiments and the eighth is described below.

Figure 9D:
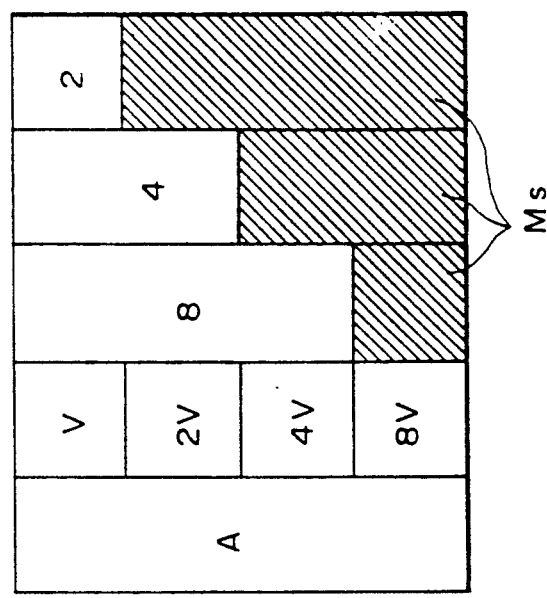
FIG. 9D shows an illustration for an explanation of an optical calculation means involved in an eighth embodiment of the present invention.
Figure 9C:
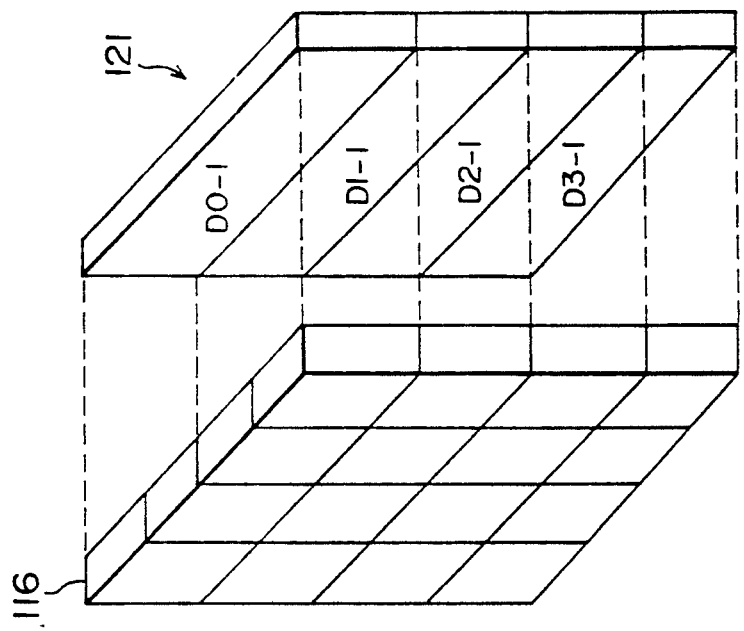
FIG. 9C shows an illustration for an explanation of an optical calculation means involved in a seventh embodiment of the present invention.

The PD array 121 comprises four pieces of oblong shaped photodiodes D0-1, D1-1, D2-1, and D3-1 as shown in FIG. 9D in the eighth embodiment. These photodiodes respectively have photosensitive surfaces, the shapes of which are elongate in the horizontal direction. These photodiodes $D_i$-1 are connected in parallel so as to be integral in the PD array 121.

It is possible to provide the PD array 121 so as to be in contact with the LED array 116, so that light emitting surface of the LED array is in contact with the photosensitive surface of the PD array 121 in the eighth embodiment. Thus, an optical system, which system serves as light direction control means, can be made unnecessary: the system should be used between the LED array and PD array if they are provided apart from each other.

A ninth embodiment of the present invention is described below with reference to FIG. 10. The ninth embodiment is obtained through a modification of the first embodiment shown in FIGS. 5A through 6A. A part of the ninth embodiment involving a difference between the first embodiment and the ninth is described below.

A reflection-type space-light-modulation-element is substituted for the two-dimentional transmission part 115 provided between the LED array 110 and the PD array 112. The reflection-type space-light-modulation-element comprises a beam splitter 200, a shutter array 201, and a reflection mirror 202.

Light emitted from the LED array 110 is transmitted through the beam splitter 200 and shutter array 201. Then, the light is reflected on the reflection mirror 202, and transmitted through the shutter array 201 again. During this process, an intensity distribution of the light is spacially modulated. After the modulation, the light is incident on the beam splitter 200 again. Then the light is reflected from the beam splitter 200 at a right angle from its original path so as to be incident on the PD array 112.

The shutter array 201 can comprise a transmission-type liquid-crystal shutter-array, or a light valve array which has a construction such that light valves of PLZT are arranged in a two-dimentional array.

Figure 5D:
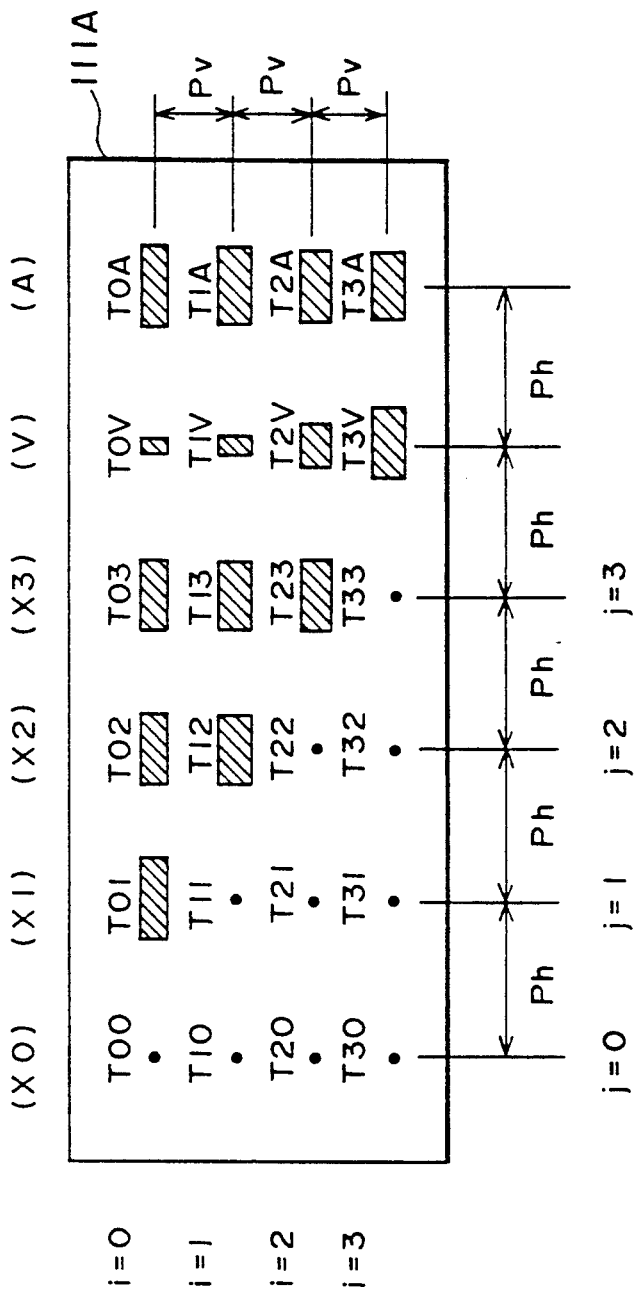

Either the transmission-type liquid-crystal shutter-array or the light valve array can be substituted for the shadowing mask plate 111A, as shown in FIG. 5D. These can realize the desired weights $W_{ij}$ by means of altering a transmittance ratio thereof. This can be realized by adjusting the transmittance Of each shutter of the transmission-type liquid-crystal shutter-array, or by adjusting the transmittance of each light valve of the light valve array.

While the light goes from the LED array 110 to the PD array 112, the light passes through the shutter array 201 twice, first in one direction and then in the reverse direction. Thus, the light is modulated in space twice by means of the shutter array 201. As a result of this, contrast of light intensities can be magnified.

It is possible to use the following method in lieu of using the LED LA in the above mentioned embodiments of the present invention. The method is that an optical signal corresponding to the input signal Sa is supplied directly into an A/D converter.

Further, the present invention is not limited to these preferred embodiments, and various variations and modifications may be made without departing from the scope of the present invention.

Some advantages of the present invention are described below.

A first advantage is that it is possible to realize a new optical A/D converter and a neural-network-type A/D converter for actual use, which has heretofore been known only as model.

A second advantage is obtained as a result of performing at least a great of the calculation for the A/D conversion by means of an optical calculation means; the advantage being that the electrical wiring can be simplified. Further, a number of comparator devices needed is not more than a number of bits of an output digital signal Sd. Thus, it is possible to supply an input and obtain an output by means of an optical signal, or an electrical signal by means of an A/D converter having a simple composition.

What is claimed is:

1. An optical analog-digital converter for converting an analog signal having a value A into an n-bit digital signal, said optical analog-digital converter comprising:
    optical calculation means for performing at least a part (2) of a calculation of a first predetermined equation (1) on said value A by means of light, said optical calculation means including:
        emission means comprising an array of emission elements for emitting light; and
        photosensitive means comprising an array of photosensitive elements for receiving the light emitted from said array of emission elements; and
    comparing means, connected to the optical calculation means, for performing at least a predetermined thresholding on a result of the calculation of said first predetermined equation (1);
    said first predetermined equation (1) being $$U_i=[\{\{\Sigma(W_{ij}\times X_j)+h_j\}\times V\}+A]\times S_i \quad (1)$$

the calculation of said first predetermined equation (1) being performed for $i=0, 1, \ldots, n-1$ respectively, and said $V_{ij}$ being 0 if (said i) $\geq$ (said j)$\leq 0$, or {2J (referred to as a result of raising 2 to the said jth power hereinafter)} if (said j)>(said i)$\geq 0$, said $h_i$ being {2i (referred to as a result of raising 2 to said ith power)}, or {(2**i)$-\epsilon$}($|\epsilon|\leq 2$); and
where V and $S_i$ respectively have any desired positive values, and
said $\Sigma$ represents a summation of each of the expressions following thereto for $j=0, 2, \ldots, n-1$;
    said part (2) of said first predetermined equation (1) being $$[\{\Sigma(W_{ij}\times X_j)\}V]\times S_i \quad (2),$$

said predetermined thresholding respectively comparing the result $V_i$ of the calculations of each of said first predetermined equation (1) to a predetermined threshold value; a value 1 or 0 being then selected, said selection based on results of the respective comparisons; and
respective ones of results of said selection of each of said predetermined thresholding performed on each of the results $U_i$ being then assigned to respective ones of said $X_i$, the calculation of said first predetermined equation (1) being then performed repeatedly, using each of said $X_i$ obtained from the calculation of said first predetermined equation (1) and the corresponding thresholding until respective ones of said $X_i$ coverage on respective solutions; said respective solutions of each of said $X_i$ for $i=0, 1, \ldots, n-1$, being then provided as respective digit values of said n-bit digital signal.

2. The optical analog-digital converter according to claim 1, wherein:
    a complement calculation of an equation (3) is performed on said value A, the equation (3) for said complement calculation being $$YA=\theta-A \ldots \quad (3)$$

where $\theta=$ {2**n (referred to as a result of raising 2 to the said nth power hereinafter)} $-1$ in the equation (3);

a calculation of a second predetermined equation (4) is performed on the result YA of said complement calculation of the equation (3) instead of the calculation of said first predetermined equation (1), said second predetermined equation (4) being $$YU_i\{\}\}\Sigma(|W_{ij}|\times X_j)+|h_i|\}\times V\}+YA[\times S_i \ldots \quad (4);$$

said predetermined thresholding is then performed on the result $YU_i$ of the calculation of said second predetermined equation (4), $\theta \times S_i$ being used as said predetermined threshold value in said predetermined thresholding;

said $\Sigma$ represents a summation of each of the expressions following thereto for $j=0, 1, \ldots, n-1$.

respective ones of said result of said predetermined thresholding performed on each said result $YU_i$ are then assigned to respective ones of said $X_i$, the calculation of said second predetermined equation (4) being then performed repeatedly using each of said $X_i$ obtained from the calculation of the corresponding said second predetermined equation (4) until said respective $X_i$ converge on respective solutions; respective ones of said solutions of said $X_i$ for $i=0, 1, \ldots, m-1$, are then provided as respective digit values of said x-bit digital signal; and said optical calculation means performs the calculation of said second predetermined equation (4)

3. The optical analog-digital converter according to claim 1, wherein:

a calculation of a third predetermined equation (5) is performed on said value A, said third predetermined equation (5) being $$ZU_i=[\{\{\Sigma(|W_{ij}|\times X_j)+|h_i|\}\times A\}\times S_i \ldots \quad (5),$$

said predetermined thresholding is then performed on a result $ZU_i$ of the calculation of said third predetermined equation (4), $\theta \times S_i$ being used as said predetermined threshold value in said predetermined thresholding; said $\Sigma$ represents a summation of each of the expression following thereto for $j=0, 1, \ldots, n-1$; and $\theta=(2^{**}n)-1$;

said respective results of said predetermined thresholding performed on each said result $ZU_i$ are then assigned to respective ones of said $X_i$, the calculation of said third predetermined equation (5) is then performed repeatedly using each of said $X_i$ obtained from the calculation of the corresponding said third calculation (5) and the corresponding thresholding until said respective $X_i$ converge on respective solutions;

said optical analog-digital converter further comprises inverting means for inverting a value of said respective solution of each of said $X_i$ for $i=0, 1, \ldots, n-1$ so as to change a value "1" to "0" or a value "0" to "1" respectively; then said inverting means provides respective solutions of said inverting as respective digit values of said x-bit digital signal; and said optical calculation means performs the calculation of said third predetermined equation (5).

4. The optical analog-digital converter according to claim 1, wherein said analog signal comprises an analog optical signal; and said analog optical signal is supplied to said optical calculation means.

5. The optical analog-digital converter according to claim 1, wherein said analog signal comprises an electric analog signal; said comparing means comprises an electric comparator; and said electric analog signal is supplied to said electric comparator.

6. The optical analog-digital converter according to claim 1, wherein:

said optical calculation means comprises:

said array of emission elements of said emission means comprising an array of emission element $L_j$ for $j=0, 1, \ldots, n-1$, each of said emission elements $L_j$ emitting respective light, an intensity of each of said light being emitted from said emission elements being in proportion to respective values of said $X_j$ for $j=0, 1, \ldots, n-1$, said emission elements $L_j$ for $j=0, 1, \ldots, n-1$ being located linearly;

transmission means comprising a matrix of transmission areas $T_{ij}$ for $i=0, 1, \ldots, n-1$ in said i and for $j=0, 1, \ldots, n-1$, each row thereof being located linearly in a same direction as that of said array of emission elements $L_j$, each column thereof being located linearly in a direction perpendicular to that of said array of emission elements $L_j$, each of said transmission areas $T_{ij}$ having a respective transmittance, each transmittance thereof being in proportion to an absolute value of a respective one of said $W_{ij}$ for i, $j=0, 1, \ldots, n-1$ for said respective i of each of said rows have transmittances respectively corresponding to $W_{ij}$ for $j=0, 1 \ldots, n-1$ for said respective i, and said transmission areas $T_{ij}$ for $i=0, 1, \ldots, n-1$ for respective j of each of said columns have transmittances respectively corresponding to $W_{ij}$ for $i=0, 1, \ldots, n-1$ for respective j;

said array of photosensitive elements of said photosensitive means comprising an array of photosensitive elements $D_i$, for $i=0, 1, \ldots, n-1$, said photosensitive element $D_i$ for $i=0, 1 \ldots, n-1$ being located linearly in a direction perpendicular to a direction of said array of emission elements $L_j$ for $j=0, 1 \ldots, n-1$; and light-direction-control means for controlling a direction of respective light emitted from each of said emission elements of said emission means so that respective light emitted from each of said emission elements $L_j$ of respective j is applied to respective columns of said transmission areas $T_{ij}$, said light-direction-control means also controlling a direction of respective light transmitted through each of said transmission areas $T_{ij}$ of said transmission means so that respective light transmitted through each of said rows of said transmission areas $T_{ij}$ is applied to respective ones of said photosensitive elements $D_i$.

7. The optical analog-digital converter according to claim 6, wherein:

said emission means further comprises emission elements LV and LA, said emission element LV and LA respective have intensities respectively in proportion to said V and said value A;

said transmission means further comprises columns of transmission areas $T_iV$ and $T_iA$ respectively for $i=0, 1, \ldots, n-1$, an intensity of each of said transmission areas $T_iV$ being in proportion to an absolute value of respective ones of said $h_i$, and intensities of said transmission areas $T_iA$ being the same as each other; and said light-direction-control means controls a direction of respective light emitted from each of said emission elements of said emission means so that respective light emitted from each of said emission elements $L_j$, LV, or LA is applied to respective columns of said transmission areas $T_{ij}$, $T_iV$, or $T_iA$, said light-direction-control means also controls a direction of respective light transmitted through each of said transmission areas $T_{ij}$, $T_iV$, or $T_iA$ of said transmission means so that respective light transmitted through each of said rows of said transmission areas $T_{ij}$, $T_iV$, and $T_iA$ is applied to respective ones of said photosensitive elements $D_i$.

8. The optical analog-digital converter according to claim 1, wherein:

said optical calculation means comprises:

said array of emission elements of said emission means comprising an array of emission elements $L_j$ for $j=0, 1, \ldots, n-1$, each of said emission element $L_j$ emitting respective light, an intensity of each of said light being in proportion to respective values of said $X_j$ for $j=0, 1, \ldots, n-1$, said emission elements $L_j$ for $j=0, 1, \ldots, n-1$ being located linearly;

a mask plate comprising a matrix of mask areas $T_{ij}$ for $i, j=0, 1, \ldots, n-1$, said mask areas being provided on said mask plate, each row of said matrix being located linearly in a same direction as the direction of said array of emission elements $L_j$, each column of said matrix being located linearly in a direction perpendicular to the direction of said array of emission elements $L_j$, each of said mask areas $T_{ij}$ having a respective opening, each of said openings being in proportion to an absolute value of respective ones of said $W_{ij}$ for $i, j=0, 1, \ldots, n-1$, the arrangement of said matrix of said mask areas $T_{ij}$ being such that said mask areas $T_{ij}$ for $j=0, 1, \ldots, n-1$ for said respective i of each of said rows have transmittances respectively corresponding to $W_{ij}$ for $j=0, 1, \ldots, n-1$ for said respective i, and said mask areas $T_{ij}$ for $i=0, 1, \ldots, n-1$ for respective j of each of said columns have transmittances respectively corresponding to $W_{ij}$ for $i=0, 1, \ldots, n-1$ for respective j;

said array of photosensitive elements of said photosensitive means comprising an array of photosensitive elements $D_i$, for $i=0, 1, \ldots, n-1$, said photosensitive elements $D_i$ for $i=0, 1, \ldots, n-1$ being located linearly in a direction perpendicular to the direction of said array of emission elements $L_j$ for $j=0, 1, \ldots, n-1$; and light-direction-control means for controlling a direction of respective light emitted from each of said emission elements of said emission means so that respective light emitted from each of said emission elements $L_j$ is applied to respective columns of said mass areas $T_{ij}$, said alight-direction-control means also controlling a direction of respective light passing through each of said openings of said mask areas $T_{ij}$ of said mask plate so that respective light passing through each of said rows of said mass areas $T_{ij}$ is applied to respective ones of said photosensitive elements $D_i$.

9. The optical analog-digital converter according to claim 1, wherein:

said optical calculation means comprises:

said matrix of emission elements of said emission means comprising a matrix of emission elements $L_{ij}$ for $i, j=0, 1, \ldots, n-1$, each row thereof being located linearly, each column thereof being located linearly in a direction perpendicular to that of each row thereof, each of said emission elements $L_{ij}$ emitting a respective light, the respective intensity of each of said light being in proportion to an absolute value of said respective $W_{ij} x_j$ for $i, j=0, 1, \ldots, n-1$, the arrangement of said matrix of said emission elements $L_{ij}$ being such that said emission elements $L_{ij}$ for $j=0, 1, \ldots, n-1$ for respective said i of each of said rows have light intensities respectively corresponding to $W_{ij}$ for $j=0, 1, \ldots, n-1$ for said respective i, and said emission elements $L_{ij}$ for $j=0, 1, \ldots, n-1$ for said respective i of each of said columns have light intensities respectively corresponding to $W_{ij}$ for $i=0, 1, \ldots, n-1$ for respective j;

said array of photosensitive elements of said photosensitive means comprising an array of photosensitive elements $D_i$, for $i=0, 1, \ldots, n-1$, said photosensitive elements $D_i$ for $j=0, 1, \ldots, n-1$ being located linearly in a same direction as the direction of each of said columns of said matrix of said emission means $L_{ij}$ for $i=0, 1, \ldots, n-1$ for each said respective j; and light-direction-control means for controlling a direction of respective light emitted from each of said emission elements $L_{ij}$ of said emission means so that respective light emitted from each of said rows of said emission elements $L_{ij}$ of respective i is applied to respective ones of said photosensitive elements $D_i$.

10. An optical analog-digital conversion method for converting an analog signal having a value A into an n-bit digital signal, said optical analog-digital conversion method comprising the steps of:

(a) performing at least a part (2) of a calculation of a first predetermined equation (1) on said value A by means of light using:

emission means comprising an array of emission elements for emitting light; and photosensitive means comprising an array of photosensitive elements for receiving the light emitted from said emission elements; and (b) receiving a result of the calculation of said first predetermined equation (1) and performing at least a predetermined thresholding on the result of the calculation of said first predetermined equation (1);

said first predetermined equation (1) being $$U_i = [\{\{\Sigma(W_{ij} + X_j) + h_i \times V\} + A] \times S_i \quad (1),$$

the calculation of said first predetermined equation (1) being performed for $i=0, 1, \ldots, n-1$ respectively, and said $W_{ij}$ being 0 if (said i)$\geq$(said j)$\geq$0, or $\{2^{}j$ (referred to as a result of raising 2 to the said jth power hereinafter)$\}$ if (said j)$>$(said i)$\geq$0, said $h_i$ being $\{2^{}i$(referred to as a result of raising 2 to said ith power)$\}$, or $\{(2^{**}i) - \epsilon\}(|\epsilon| \leq 1)$; and where V and $S_i$ respectively have any desired positive values, and said $\Sigma$ represents a summation of each of the expressions following thereto for $j=0, 2, \ldots, n-1$;

said part (2) of said first predetermined equation (1) being $$[\{\Sigma(W_{ij} \times X_j)\} \times V] \times S_i \quad (2),$$

said predetermined thresholding respectively comparing the result $U_i$ of the calculations of each of said first predetermined equation (1) to a predetermined threshold value; a value 1 or 0 being then selected, said selection based on results of the respective comparisons; and respective ones of results of said selection of each of said predetermined thresholding performed on each of the results $U_i$ being then assigned to respective ones of said $X_i$, the calculation of said first predetermined equation (1) being then performed repeatedly, using each of said $X_i$ obtained from the calculation of corresponding said first predetermined equation (1) and the corresponding thresholding until respective ones of said $X_i$ coverage on respective solutions; respective said solutions of each of said $X_i$ for i=0, 1, . . . , n−1, being then provided as respective digit values of said n-bit digital signal.

11. The optical analog-digital conversion method according to claim 10, wherein:

a complement calculation of a equation (3) is performed on said value A, the equation (3) for said complement calculation being $$YA = \theta - A \ldots \quad (3),$$

where $\theta = (2^{**}n) - 1$ in the equation (3);

a calculation Of a second predetermined equation (4) is performed on the result YA of said complement calculation of the equation (3) instead of the calculation of said first predetermined equation (1), said second predetermined equation (4) being $$YU_i = [\{\{\Sigma(|W_{ij}| \times X_j) + |h_i|\} \times V\} + YA] \times S_i \ldots \quad (4),$$

said predetermined thresholding is then performed on the result $YU_i$ of the calculation of said second predetermined equation (4), $\theta \times S_i$ being used as said predetermined threshold value in said predetermined thresholding;

said $\Sigma$ represents a summation of each of the expressions following thereto for j=0, 1, . . . , n−1;

respective ones of said results of said predetermined thresholding performed on each said result $YU_i$ are then assigned to respective ones of said $X_i$, the calculation of said second predetermined equation (4) being then performed repeatedly using each of said $X_i$ obtained from the calculation of the corresponding said second predetermined equation (4) until said respective $X_i$ converge on respective solutions; respective ones of said solutions of said $X_i$ for i=0, 1, . . . , n−1 are then provided as respective digit values of said n-bit digital signal; and the calculation of said second predetermined equation (4) is performed in said step (a).

12. The optical analog-digital conversion method according to claim 10, wherein:

a calculation of a third predetermined equation (5) is performed on said value A, said third predetermined equation (5) being $$ZU_i\{\{\Sigma(|W_{ij}| \times W_j) + |h_i|\} \times V\} + A] \times S_i \ldots \quad (5),$$

said predetermined thresholding is then performed on a result $ZU_i$ of the calculation of said third predetermined equation (4), $\theta \times S_i$ being used as said predetermined threshold value in said predetermined thresholding; ,said $\Sigma$ represents a summation of each of the expressions following thereto for j=0, 1, . . . , n−1; said $\theta = (2^{**}n) - 1$; and said respective results of said predetermined thresholding performed on each said result $ZU_i$ are then assigned to respective ones of said $X_i$, the calculation of said third predetermined equation (5) is then performed repeatedly using each of said $X_i$ obtained from the calculation of the corresponding said third equation (5) and the corresponding thresholding until said respective $X_i$ converge on respective solutions;

said optical analog-digital conversion method further comprises a step (c) which inverts a value of said respective solution of each of said $X_i$ for i=0, 1, . . . , n−1 so as to change a value "1" to "0" or a value "0" to "1" respectively; then said step (c) provides respective solutions Of said inverting as respective digit values of said n-bit digital signal; and said step (a) performs the calculation of said third predetermined equation (5).

* * * * *